(12) United States Patent
Kamiyama et al.

(10) Patent No.: US 8,941,136 B2
(45) Date of Patent: Jan. 27, 2015

(54) SEMICONDUCTOR LIGHT EMITTING ELEMENT

(75) Inventors: Satoshi Kamiyama, Aichi (JP); Motoaki Iwaya, Aichi (JP); Hiroshi Amano, Aichi (JP); Isamu Akasaki, Aichi (JP); Toshiyuki Kondo, Aichi (JP); Fumiharu Teramae, Aichi (JP); Tsukasa Kitano, Aichi (JP); Atsushi Suzuki, Aichi (JP)

(73) Assignee: El-Seed Corporation, Nagoya-Shi, Aichi (JP)

( * ) Notice: Subject to any disclaimer, the term of this patent is extended or adjusted under 35 U.S.C. 154(b) by 394 days.

(21) Appl. No.: 13/394,543

(22) PCT Filed: Aug. 23, 2010

(86) PCT No.: PCT/JP2010/064154
§ 371 (c)(1),
(2), (4) Date: May 16, 2012

(87) PCT Pub. No.: WO2011/027679
PCT Pub. Date: Mar. 10, 2011

(65) Prior Publication Data
US 2012/0228656 A1 Sep. 13, 2012

(30) Foreign Application Priority Data

Sep. 7, 2009 (JP) .................................. 2009-205931

(51) Int. Cl.
*H01L 33/00* (2010.01)
*H01L 33/22* (2010.01)
*H01L 33/40* (2010.01)

(52) U.S. Cl.
CPC .............. *H01L 33/22* (2013.01); *H01L 33/007* (2013.01); *H01L 33/405* (2013.01)
USPC .............. 257/98; 257/E33.011; 257/E33.025; 257/E33.028; 257/E33.069; 438/29; 438/47; 438/125

(58) Field of Classification Search
CPC ..... H01L 33/32; H01L 21/0254; H01L 33/22; H01L 33/40; H01L 33/38; H01L 21/02458; H01L 33/007; H01L 33/04; H01L 29/2003; H01L 33/06; H01L 33/405; H01L 33/42; H01L 33/502
USPC .............. 257/98, E33.001, E33.025, E33.028, 257/E33.069; 438/29, 47, 125
See application file for complete search history.

(56) References Cited

U.S. PATENT DOCUMENTS

| 2003/0057444 A1 | 3/2003 | Niki et al. |
| 2005/0179139 A1* | 8/2005 | Lur et al. ..................... 257/768 |

(Continued)

FOREIGN PATENT DOCUMENTS

| JP | 10-270754 A | 10/1998 |
| JP | H10-270754 A | 10/1998 |

(Continued)

OTHER PUBLICATIONS

International Search Report in PCT/JP2010/027679 dated Sep. 21, 2010 (English Translation Thereof) previously submitted on Mar. 6, 2012.

(Continued)

*Primary Examiner* — Meiya Li
(74) *Attorney, Agent, or Firm* — McGinn IP Law Group, PLLC

(57) ABSTRACT

A semiconductor light emitting element includes a semiconductor stack part that includes a light emitting layer, a diffractive face that light emitted from the light emitting layer is incident to, convex portions or concave portions formed in a period which is longer than an optical wavelength of the light and is shorter than a coherent length of the light, wherein the diffractive face reflects incident light in multimode according to Bragg's condition of diffraction and transmits the incident light in multimode according to the Bragg's condition of diffraction, and a reflective face which reflects multimode light diffracted at the diffractive face and let the multimode light be incident to the diffractive face again. The semiconductor stack part is formed on the diffractive face.

16 Claims, 19 Drawing Sheets

(56) References Cited

U.S. PATENT DOCUMENTS

| | | |
|---|---|---|
| 2007/0145557 A1 | 6/2007 | Kamiyama et al. |
| 2009/0114933 A1 | 5/2009 | Osawa et al. |
| 2009/0267092 A1 | 10/2009 | Fushima et al. |
| 2010/0314642 A1 | 12/2010 | Kudo et al. |

FOREIGN PATENT DOCUMENTS

| | | |
|---|---|---|
| JP | 2005-314121 A | 11/2005 |
| JP | 2005-354020 A | 12/2005 |
| JP | 2007-273975 A | 10/2007 |
| JP | 2007-273975 A | 10/2007 |
| JP | 2008-112957 A | 5/2008 |
| JP | 2008-112957 A | 5/2008 |
| JP | 2008-141015 A | 6/2008 |
| JP | 2008-159957 A | 7/2008 |
| JP | 2009-021349 A | 1/2009 |
| JP | 2009-054882 A | 3/2009 |
| JP | 2009-158985 A | 7/2009 |
| JP | 2009-200514 A | 9/2009 |
| JP | 2010-074090 A | 4/2010 |
| WO | WO 2007/119619 A1 | 10/2007 |
| WO | WO2007/119619 A1 | 10/2007 |

OTHER PUBLICATIONS

Motokazu Yamada, et al., "InGaN-Based Near-Ultraviolet and Blue-Light-Emitting Diodes with High External Quantum Efficiency Using a Patterned Sapphire Substrate and a mesh Electrode",Japanese Journal of Applied Physics, vol. 41, L141-L143, Oct. 25, 2002.

Japanese Office Action dated Jun. 29, 2010 with English Translation.

* cited by examiner

F I G. 1
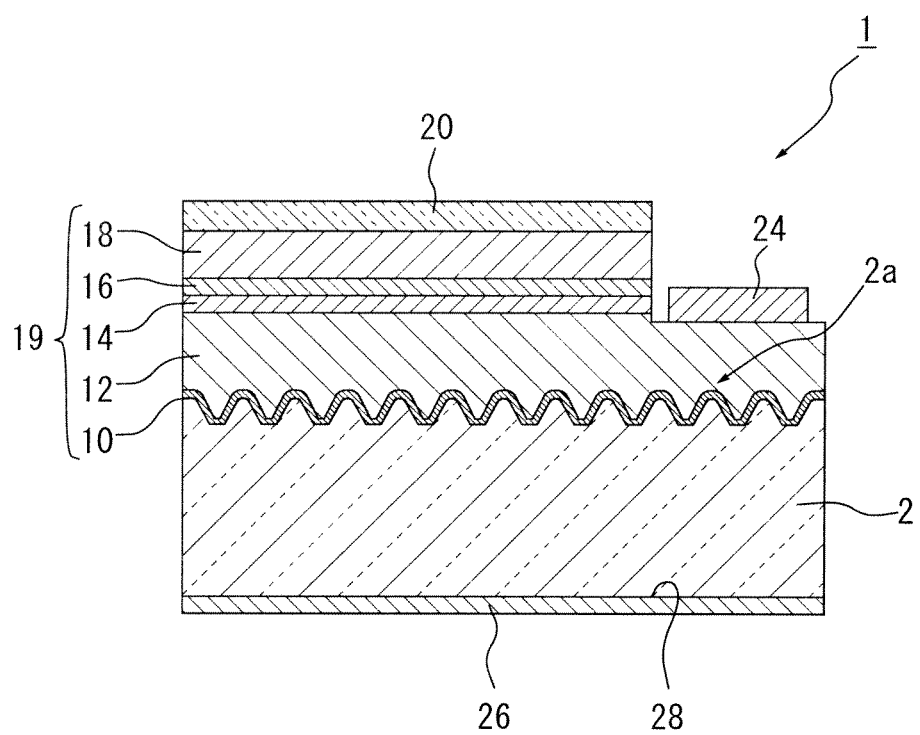

FIG. 2
(a)
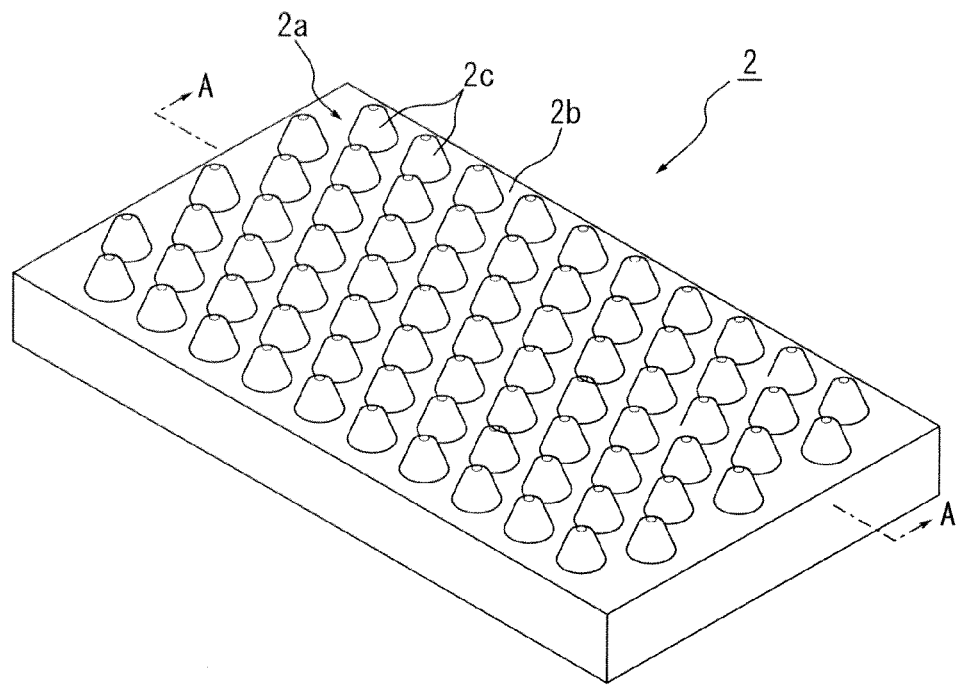
(b)
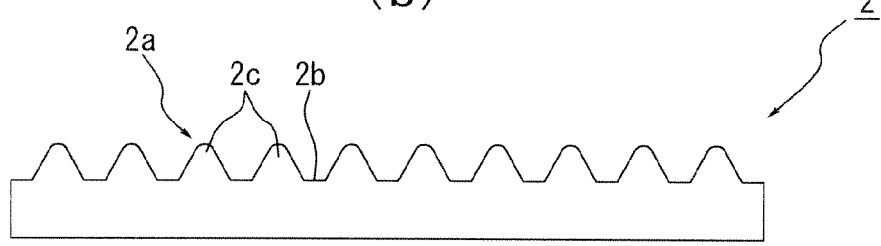
(c)
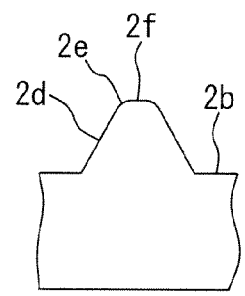

FIG. 8
(a)
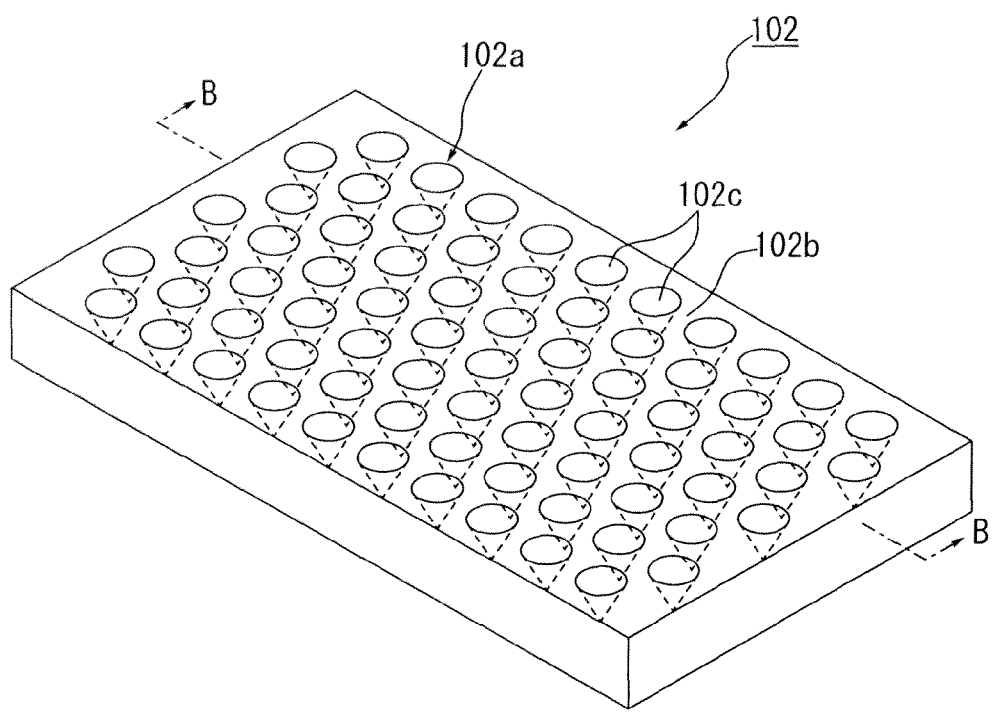
(b)
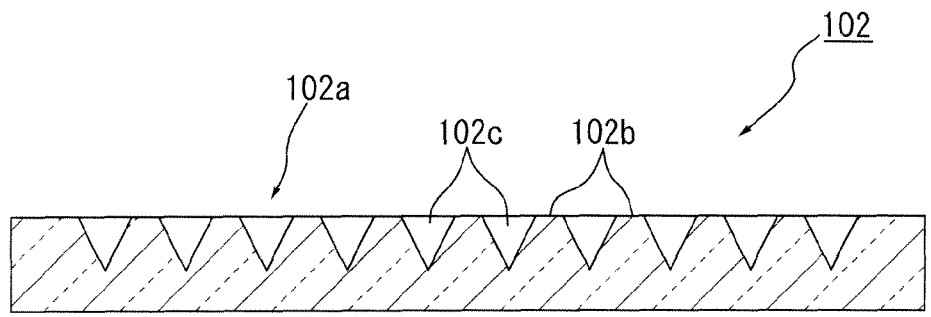

F I G. 15
(a)
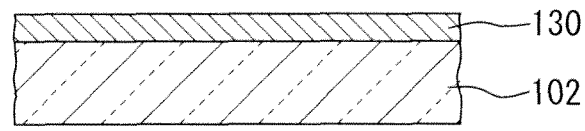
(a)
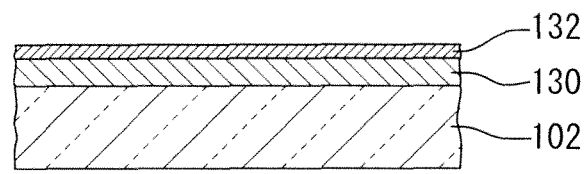
(c)
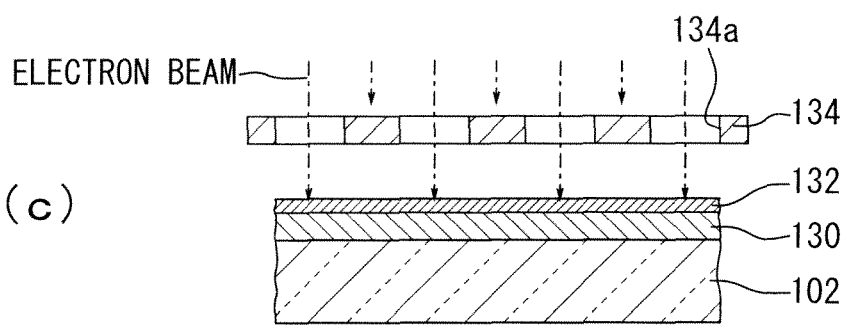
(d)
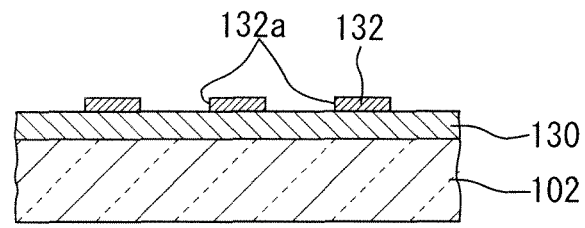
(e)
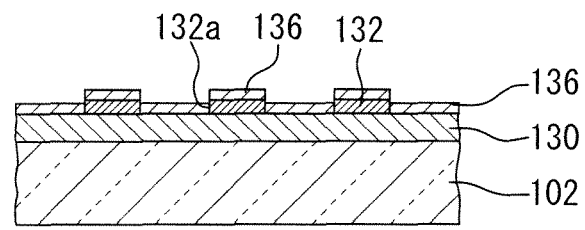

FIG. 16
(a) 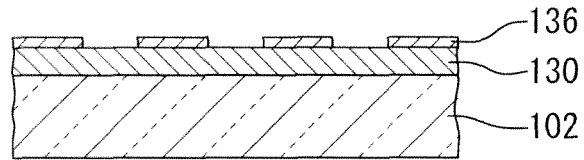
(b) 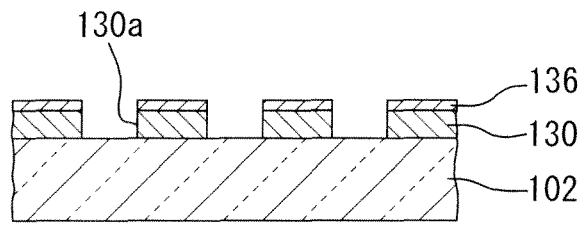
(c) 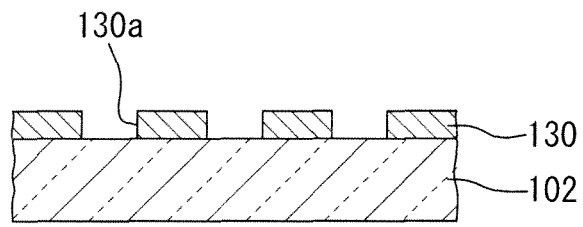
(d) 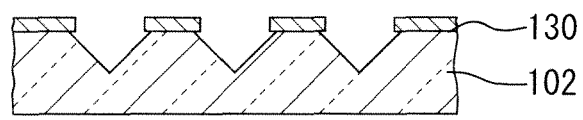
(e) 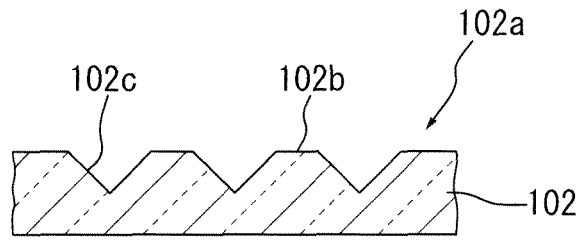

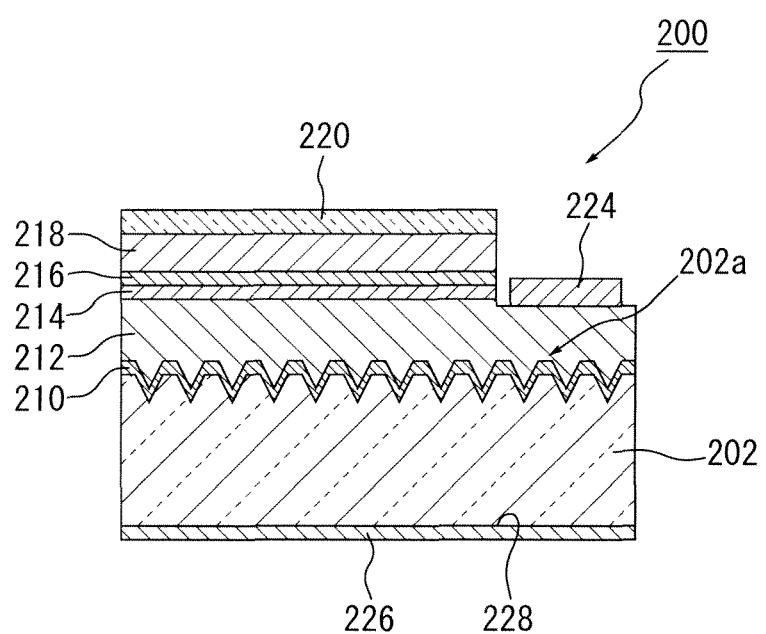
F I G. 1 7

SEMICONDUCTOR LIGHT EMITTING ELEMENT

TECHNICAL FIELD

The present invention relates to a semiconductor light emitting element.

BACKGROUND ART

High brightness light emitting diodes such as blue, green, white etc. are already put to practical use by the accumulation of essential technology such as cold deposited buffer layer technology, p-type conductivity control, n-type conductivity control, high efficiency emitting layer etc. In an existing light emitting diode, to increase the light extraction is the problem since refractive index of semiconductor is larger than refractive index of air etc. and, thus, most of light can not be taken off to the outside of the light emitting diode by total reflection or Fresnel reflection.

For solving this problem, a concavo-convex structure which is worked on the semiconductor surface in several micrometer period is proposed (for example, see the non-patent literature 1). When a concavo-convex structure is provided at an extraction side of the semiconductor surface, the total reflection is lost by the light scattering effect and about 50% transmission can be obtained in the relatively wide radiation angle, thus, the light extraction efficiency can be improved to about 50%.

Also, to increase the light extraction by providing the period of the concavo-convex structure which is equal to or smaller than twice the optical wavelength is proposed(for example, see the patent literature 1). In this case, the mechanism for extracting light differs from the period of several micrometer of the concavo-convex structure. Wave nature of light appears and the border of reflective index disappears, and thus, Fresnel reflection is suppressed. Such structure is called photonic crystal or moth-eye structure and can increase the light extraction up to about 50%.

CITATION LIST

Patent Literature

PATENT LITERATURE 1: Japanese Unexamined Patent Application Publication No. 2005-354020

Non-Patent Literature

NON-PATENT LITERATURE 1: Japanese Journal of Applied Physics Vol.41, 2004, L1431

SUMMARY OF THE INVENTION

Technical Problem

However, the increase of the light extraction in the patent literature 1 and the non-patent literature 1 is limited and a further increase of the efficiency is desired.

The present invention has been achieved in view of the above-mentioned background, thus, an object of the present invention is to provide a semiconductor light emitting element which can increase the light extraction efficiency.

Technical Solution

In order to achieve the above purpose, in the present invention, a semiconductor light emitting element comprising a semiconductor stack part including a light emitting layer is formed on a main surface of a substrate, a diffractive face that light emitted from the light emitting layer is incident to, that convex portions or concave portions are formed in a period which is longer than an optical wavelength of the light and is shorter than a coherent length of the light, is formed on a main surface side of the substrate, and a reflective face which reflects light diffracted at the diffractive face and let this light be incident to the diffractive face again is formed on a back surface side of the substrate is provided.

In the above semiconductor light emitting element, the period of convex portions or concave portions may be longer than twice optical wavelength.

In the above semiconductor light emitting element, the period of convex portions or concave portions is equal to or less than a half of the coherent length.

In the above semiconductor light emitting element, the light emitting layer may emit blue light and the period may be equal to or more than 300 nm and may be equal to or less than 1500 nm.

In the above semiconductor light emitting element, the diffractive face may be provided at an interface of materials whose diffractive index difference is equal to or more than 0.5.

Effect of the Invention

According to the semiconductor light emitting element of the present invention, it can increase the light extraction efficiency.

BRIEF DESCRIPTION OF THE DRAWINGS

FIG. 1 is a typical cross-sectional drawing of a semiconductor light emitting element of a first embodiment of this invention.

FIG. 2 is drawings of a sapphire substrate, and (a) shows a typical perspective drawing, (b) shows a typical explanation drawing of an A-A cross section and (c) shows a typical magnified drawing.

FIG. 8 is drawings of a sapphire substrate, and (a) shows a typical perspective drawing and (b) shows a typical explanation drawing of a B-B cross section.

FIG. 15 is an explanation drawing for processing a sapphire substrate, and (a) shows a substrate that a first mask layer is formed on a diffractive surface, (b) shows a substrate that a resist layer is formed on a first mask layer, (c) shows a substrate that an electron beam is selectively irradiated to a resist layer, (d) shows a substrate that a resist mask is developed and removed, (e) shows a substrate that a second mask layer is formed.

FIG. 16 is an explanation drawing for processing a sapphire substrate, and (a) shows a substrate that a resist layer is completely removed, (b) shows a substrate that a first layer is etched by using a second mask layer as a mask, (c) shows a substrate that a second mask layer is removed, (d) shows a substrate that a diffractive face etched by using a first mask layer as a mask and (e) shows a substrate that a first mask layer is removed.

FIG. 17 is a typical cross-sectional drawing of a semiconductor light emitting diode element of an other embodiment of this invention.

DESCRIPTION OF EMBODIMENTS

Figure 3:
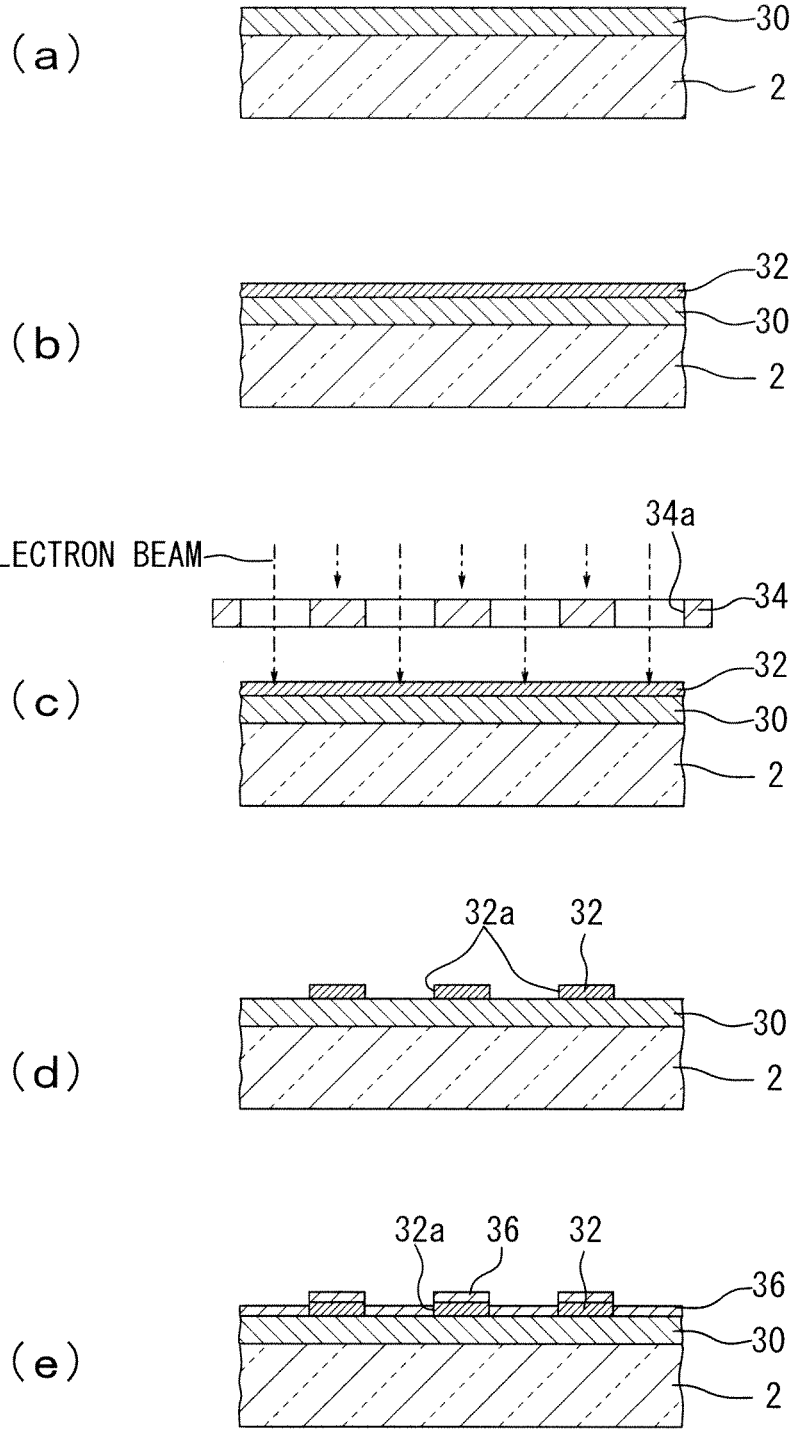
FIG. 3 is an explanation drawing for processing a sapphire substrate, and (a) shows a substrate that a first mask layer is formed on a diffractive face, (b) shows a substrate that a resist layer is formed on a first mask layer, (c) shows a substrate that an electron beam is selectively irradiated to a resist layer, (d) shows a substrate that a resist mask is developed and removed, (e) shows a substrate that a second mask layer is formed.

FIG. 1 to FIG. 4 show a first embodiment of this invention and FIG. 1 is a typical cross-sectional drawing of a semiconductor light emitting element.

As shown in FIG. 1, a light emitting element 1 has a semiconductor layer stack part 19 consisting of group-III nitride semiconductor layers, which is formed on a main surface of a sapphire substrate 2 having a diffractive face 2a. This light emitting element 1 is face-up type and light is mainly extracted from an opposite side to the sapphire substrate 2. The group-III nitride semiconductor layers have a buffer layer 10, an n-type GaN layer 12, a multiple quantum well active layer 14, an electron blocking layer 16 and a p-type GaN layer 18 in this order from the sapphire substrate 2 side. A p-side electrode 20 is formed on the p-type GaN layer 18 and an n-side electrode 24 is formed on the n-type GaN layer 12.

The sapphire substrate 2 has the diffractive face 2a at the main surface side, that is C-face ($\{0001\}$) a nitride semiconductor grows. A flat part 2b (see FIG. 2(a)) and a plurality of convex portions 2c which are periodically formed in the flat part 2b (see FIG. 2(a)) are formed at the diffractive face 2a. A shape of each convex portion 2c can be a cone shape such as a circular cone, polygonal cone etc. or a cone trapezoidal shape such as a circular cone trapezoidal shape, polygonal cone trapezoidal shape etc., which is shaped like cutting upper part of a cone. In this embodiment, a diffractive effect is obtained by each convex portion 2c which is periodically positioned.

A reflective film 26 consisting of, for example, Al is formed at a side of the back surface of the sapphire substrate 2. In this light emitting element 1, a face at the sapphire substrate 2 side of the reflective film 26 is a reflective face 28 and light emitted from the active layer 14 is transmitted through the diffractive face 2a by a diffractive effect and transmitted light is reflected at the reflective face 28. In this way, light can be extracted in multimode since light which is transmitted by a diffractive effect is incident to the diffractive face 2a and is transmitted through the diffractive face 2a again by a diffractive effect at the diffractive face 2a.

The buffer layer 10 is formed on the diffractive face 2a of the sapphire substrate 2 and consists of AlN. In this embodiment, the buffer layer 10 is formed by MOCVD (Metal Organic Chemical Vapor Deposition) method and can be also formed by sputtering method. The buffer layer 10 has a plurality of concave portions which have a cone trapezoidal shape and are periodically formed along each convex portion 2c at diffractive face 2a side. The n-type GaN layer 12 as a first conductivity type layer is formed on the buffer layer 10 and consists of n-GaN. The multiple quantum well active layer 14 as an emitting layer is formed on the n-type layer 12 and consists of GaInN/GaN. The multiple quantum well active layer 14 emits blue light by an injection of electrons and holes. In this document, blue light is, for example, light having peak wavelength of 430 nm or more to 480 nm or less. In this embodiment, the multiple quantum well active layer 14 emits at peak wavelength of 450 nm.

The electron blocking layer 16 is formed on the multiple quantum well active layer 14 and consists of p-AlGaN. The p-type GaN layer 18 as a second type conductivity layer is formed on the electron blocking layer 16 and consists of p-GaN. It is formed by an epitaxial growth of group-III nitride semiconductor from the buffer layer 10 to the p-type layer 18. Although the convex portions 2c are periodically formed on the diffractive face 2a of the sapphire substrate 2, it is planarized by a lateral growth in early phase of growing a group-III nitride semiconductor. The semiconductor layer constitution is arbitrary if it contains at least a first conductivity layer, an active layer and a second conductivity layer and the active layer emits by recombination of electrons and holes when applying a voltage between the first conductivity layer and the second conductivity layer.

The p-side electrode 20 is formed on the p-type GaN layer 18 and consists of transparency material such as ITO (Indium Tin Oxide) etc. In this embodiment, the p-side electrode 20 is formed by a vacuum evaporation method, sputtering method, CVD (Chemical Vapor Deposition) method etc.

The n-side electrode 24 is formed on the n-type GaN layer 12 exposed by etching the p-type GaN layer 18 to the n-type GaN layer 12. The n-side electrode 24 consists of, for example, Ti/Al/Ti/Au and formed by a vacuum evaporation method, sputtering method, CVD (Chemical Vapor Deposition) method etc.

The sapphire substrate 2 is explained in reference to FIG. 2. FIG. 2 is drawings of a sapphire substrate, and (a) shows a typical perspective drawing, (b) shows a typical explanation drawing of an A-A cross section and (c) shows a typical magnified drawing.

As shown in FIG. 2, in planner view, the diffractive face 2a is aligned in intersections of hypothetical triangle grid with a predetermined period so that centers of each convex portion 2c are positioned at equilateral triangle vertices. The period of each convex portion 2c is longer than an optical wavelength of light emitted from the multiple quantum well active layer 14 and shorter than a coherent length of the light. The term "period" means that a distance between peak height positions of adjacent convex portions 2c. The term "optical wavelength" means that a value actual wavelength is divided by a refraction index. The term "coherent length" corresponds to a distance coherence disappears by counteracting periodic wave oscillation each other caused by differences of individual wavelength in photon group of predetermined spectrum width. When a light wavelength is $\lambda$ and a half maximum full-width of the light is $\Delta\lambda$, a coherent length $1c$ is approximately indicated by the following formula: $1c=(\lambda^2/\Delta\lambda)$. It is preferable that the period of each convex portion 2c is longer than twice the optical wavelength of light emitted from the multiple quantum well active layer 14. It is preferable that the period of each convex portion 2c is equal to or shorter than a half of the coherent length of light emitted from the multiple quantum well active layer 14.

In this embodiment, the period of each convex portion 2c is 500 nm. Since a wavelength of light emitted from the active layer 14 is 450 nm and a refraction index of a group-III nitride semiconductor is 2.4, the optical wavelength is 187.5 nm. Also, since a half maximum full-width of the light emitted from the active layer 14 is 63 nm, the coherent length of the light is 3214 nm. The period of the diffractive face 2a is longer than twice the optical wavelength of light emitted from the active layer 14 and equal to or shorter than a half of the coherent length of the light.

In this embodiment, as shown in FIG. 2(c), each convex portion 2c of the diffractive face 2a has a side surface 2d which extends upward from the flat part 2b, a curved portion 2e which curves and extends to center side of the convex portion 2c from the upper end of the side surface 2d and an upper surface 2f which is flat and is continuously formed from the curved portion 2e. As described later, the curved portion 2e is formed by rounding off the corner by wet-etching the convex portion 2c (see FIG. 4(e)) which is formed a corner made by the side surface 2d and the upper surface 2f before forming the curved portion 2e. It is allowable that the flat upper surface 2f is lost by wet-etching and the entire upper side of the convex portion 2c becomes the curved portion 2e. In this embodiment, concretely, each convex portion 2c has a base end section whose diameter is 200 nm, and the height of each convex portion 2c is 250 nm. The diffractive face 2a of the sapphire substrate 2 is the flat part 2b except each convex portion 2c and a lateral growth of semiconductor layer is assisted.

Figure 4:
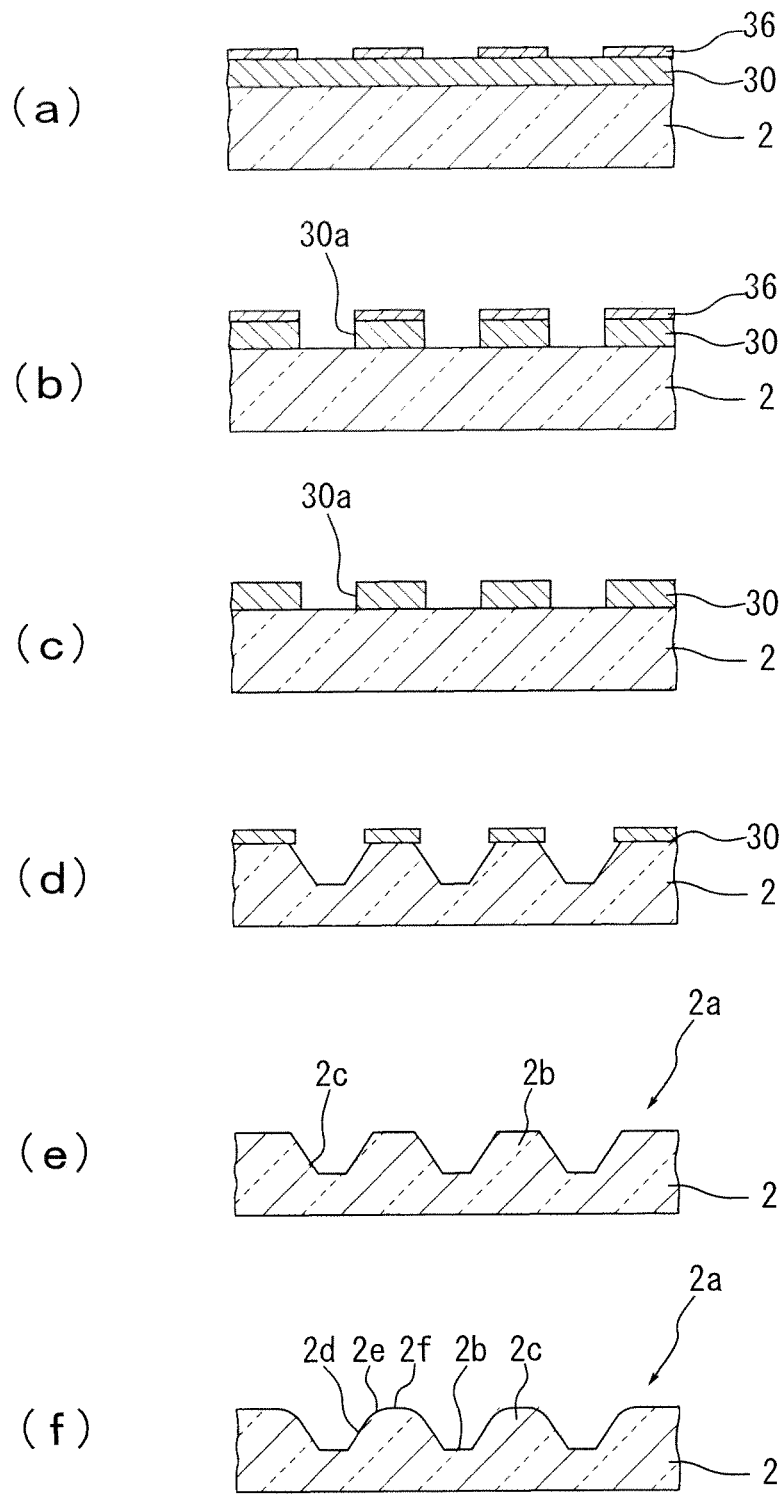
FIG. 4 is an explanation drawing for processing a sapphire substrate, and (a) shows a substrate that a resist layer is completely removed, (b) shows a substrate that a first layer is etched by using a second mask layer as a mask, (c) shows a substrate that a second mask layer is removed, (d) shows a substrate that a diffractive face etched by using a first mask layer as a mask, (e) shows a substrate that a first mask layer is removed and (f) shows a substrate that a curved portion is provided at a convex portion by wet etching.

A method for manufacturing the sapphire substrate 2 for the light emitting element 1 is explained in reference to FIG. 3 and FIG. 4. FIG. 3 is an explanation drawing for processing a sapphire substrate, and (a) shows a substrate that a first mask layer is formed on a diffractive face, (b) shows a substrate that a resist layer is formed on a first mask layer, (c) shows a substrate that an electron beam is selectively irradiated to a resist layer, (d) shows a substrate that a resist mask is developed and removed, (e) shows a substrate that a second mask layer is formed.

First, as shown in FIG. 3(a), a sapphire substrate 2 shaped like a flat plate is prepared and a first mask layer 30 is formed on the main surface of the sapphire substrate 2. The first mask layer 30 consists of, for example, $SiO_2$ and formed by a sputtering method, vacuum evaporation method, CVD method etc. The thickness of the first mask layer 30 is arbitrary and, for example, it is 1.0 μm.

Next, as shown in FIG. 3(b), a resist layer 32 is formed on the first mask layer 30 of the sapphire substrate 2. The resist layer 32 consists of, for example, electron beam sensitive material of ZEP etc. manufactured by Japan Zeon Corporation and is applied on first mask layer 30. The thickness of the resist layer 32 is arbitrary and, for example, 100 nm to 2.0 μm.

Next, as shown in FIG. 3(c), a stencil mask 34 is set with a clearance from the resist mask 32. The clearance between the resist mask 32 and the stencil mask 34 is 1.0 μm to 100 μm. The stencil mask 34 consists of, for example, material such as diamond, SiC etc. The thickness of the stencil mask 34 is arbitrary and, for example, 500 nm-100 μm. The stencil mask 34 has apertures 34a that an electron beam transmits selectively.

After that, as shown in FIG. 3(c), an electron beam is irradiated to the stencil mask 34 and the resist layer 32 is exposed to an electron beam transmitting the apertures 34a of the stencil mask 34. Concretely, a pattern of the stencil mask 34 is printed to the resist layer 32, for example, by using an electron beam of 10-100 μC/cm².

After an electron beam has been irradiated, the resist layer 32 is developed by using predetermined developing fluid. In this way, as shown in FIG. 3(d), a part that an electron beam irradiated is eluted in the developing fluid and a part that an electron beam did not irradiate stays, thus, apertures 32a are formed. In case of using ZEP manufactured by Japan Zeon Corporation as the resist layer 32, for example, amyl acetate can be used as the developing fluid.

Next, as shown in FIG. 3(e), a second mask layer 36 is formed on the first mask layer 30 that the resist layer 32 is patterned. In this way, the second mask layer 36 is patterned on the first mask layer 30 by electron beam irradiation. The second mask layer 36 consists of, for example, Ni and formed by a sputtering method, vacuum evaporation method, CVD method etc. The thickness of the second mask layer 36 is arbitrary and, for example, it is 20 nm.

FIG. 4 is an explanation drawing for processing a sapphire substrate, and (a) shows a substrate that a resist layer is completely removed, (b) shows a substrate that a first layer is etched by using a second mask layer as a mask, (c) shows a substrate that a second mask layer is removed. (d) shows a substrate that a diffractive face etched by using a first mask layer as a mask, (e) shows a substrate that a first mask layer is removed and (f) shows a substrate that a curved portion is provided at a convex portion by wet etching.

As shown in FIG. 4(a), the resist layer 32 is removed by using parting agent. For example, it can be removed in condition that the resist layer 32 is soused in the parting agent and ultrasonic wave is irradiated for predetermined time. Concretely, for example, diethyl ketone can be used as parting agent. In this way, a pattern of the second mask layer 36 that has a shape the pattern of apertures 34a of the stencil mask 34 is inverted is formed on the first mask layer 30.

As shown in FIG. 4(b), the first mask layer 30 is dry-etched by using the second mask layer 36 as a mask, In this way, apertures 30a are formed in the first mask layer 30 and a pattern of the first mask layer 30 is formed. At that time, etching gas having a tolerance that the sapphire substrate 2 and the first mask layer 30 are larger than the second mask layer 36 is used. For example, in case that the first mask layer 30 is $SiO_2$ and the second mask layer 36 is Ni, if fluorine series gas is used, the pattern of the first mask layer 30 can be formed with precision since Ni has etching selectivity of about 100 to $SiO_2$.

After that, as shown in FIG. 4(e), the second mask layer 36 on the first mask layer 30 is removed. In case that the first mask layer 30 is $SiO_2$ and the second mask layer 36 is Ni, Ni can be removed by sousing in hydrochloric acid and nitric acid which are mixed in a ratio 1:1 and diluted with water or dry-etching using argon gas.

After that, as shown in FIG. 4(d), the sapphire substrate 2 is dry-etched by using the first mask layer 30 as a mask. At that time, a reverse pattern of apertures 34a of the stencil mask 34 is transcribed on the sapphire substrate 2, since only a part that the first mask layer 30 is removed in the sapphire substrate 2 is exposed to etching gas. At that time, a part which is not covered by the first mask layer 30 can be etched selectively since the first mask layer 30 has a larger tolerance to the etching gas than the sapphire substrate 2. The etching is finished when an etching depth of the sapphire substrate 2 reaches the predetermined depth. For example, chlorine series gas such as $BCl_3$ etc. is used as the etching gas.

After that, as shown in FIG. 4(e), the first mask layer 30 left on the sapphire substrate 2 is removed by using predetermined parting agent. In this way, the convex portion 2c which is formed a corner made by the side surface 2d and the upper surface 2f before forming the curved portion 2e is formed. For example, in case that the first mask layer 30 is $SiO_2$, dilute hydrofluoric acid can be used as parting agent.

After that, as shown in FIG. 4(f), the curved portion 2e is formed by rounding off the corner by wet-etching the convex portion 2c. Although etchant is arbitrary, for example, phosphoric acid aqueous solution heated to about 160° C., called "hot phosphoric acid" can be used. Other methods such as dry-etching can be used as an etching method and the point is to form the curved portion 2e to the corner of convex portion 2c.

A group-III nitride semiconductor is epitaxially grown by using a lateral growth on the diffractive face 2a of the sapphire substrate 2 as made above and the light emitting element 1 is manufactured by dividing to a plurality of the light emitting element 1 by dicing after forming each electrode.

In the light emitting element 1 as made above, incident light having an angle over the total reflection optimal angle at the interface of the sapphire substrate 2 and the group-III nitride semiconductor can be extracted to the outside of element by using a diffractive effect since it comprises the diffractive face 2a having the convex portions 2c that the period is longer than the optical wavelength of light emitted from the multiple quantum well active layer 14 and shorter than the coherent length of the light, and the reflective face 28 which reflects light diffracted at the diffractive face 2a and let the reflected light be incident to the diffractive face 2a again. Concretely, light can be extracted in multimode since light which is transmitted by a diffractive effect is incident to the diffractive face 2a and is transmitted through the diffractive face 2a again by a diffractive effect at the diffractive face 2a. In this embodiment, since light is extracted by a diffractive effect, a different effect from the one that light is extracted by scattering effect is obtained and a light extraction efficiency of the light emitting element 1 can be highly improved.

The number of convex portions 2c per unit area increases since the convex portion 2c is formed in a short period. In case that the period of the convex portion 2c exceeds twice the coherent length, if the convex portion 2c has a corner dislocations originate, the emission efficiency is not influenced since the dislocation density is small. However, if the period of the convex portion 2c is shorter than the coherent length, the emission efficiency highly decreases since the dislocation density in the buffer layer 10 of the semiconductor layer stack part 19 increases. If the period is equal to or lower than 1 μm, this tendency highly increases. This is a new problem in case that the period of convex portion 2c is equal to or lower the coherent length. In prior arts, although it is disclosed that the period is shorter with only focusing the extracting efficiency of emitted light, it is not considered that the emission efficiency decreases at all. The decrease of emission efficiency is occurred regardless of a manufacturing method for the buffer layer 10 and it is occurred in case of MOCVD method and sputtering method. In this embodiment, a corner dislocations originate does not exist in upper side of each convex portion 2c, dislocation is not generated from on the corner when forming the buffer layer 10. As a result, crystal has a relatively low dislocation density in the multiple quantum well active layer 14. The emission efficiency does not decrease by forming the convex portion 2c at the diffractive face 2a, thus, the above new problem is solved.

In the light emitting element 1 of this embodiment, although the convex portions 2c are formed on the diffractive face 2a of the sapphire substrate 2, since an end of dislocations is generated when a group-III nitride semiconductor is planarized by a lateral growth, crystal which has a relatively low dislocation density is obtained in the group-III nitride semiconductor. As a result, crystal has a relatively low dislocation density in the multiple quantum well active layer 14 and the emission efficiency does not decrease by forming the convex portion 2c at the diffractive face 2a.

In the above embodiment, although it shows that the light emitting element 1 is face-up type, for example, as shown in FIGS, the light emitting element 1 can be flip-chip type. The light emitting element 1 in FIG. 5 has a buffer layer 10, an n-type GaN layer 12, a multiple quantum well active layer 14, an electron blocking layer 16 and up-type GaN layer 18 in this order on the sapphire substrate 2, and a p-side electrode 20 consisting of reflective material such as Ag system, Rh system etc. is formed on the p-type GaN layer 18 and n-side electrode 24 is formed on the n-type GaN layer 12. In this case, a surface of the p-type GaN layer 18 of the p-side electrode 20 is a reflective face 22.

Figure 6:
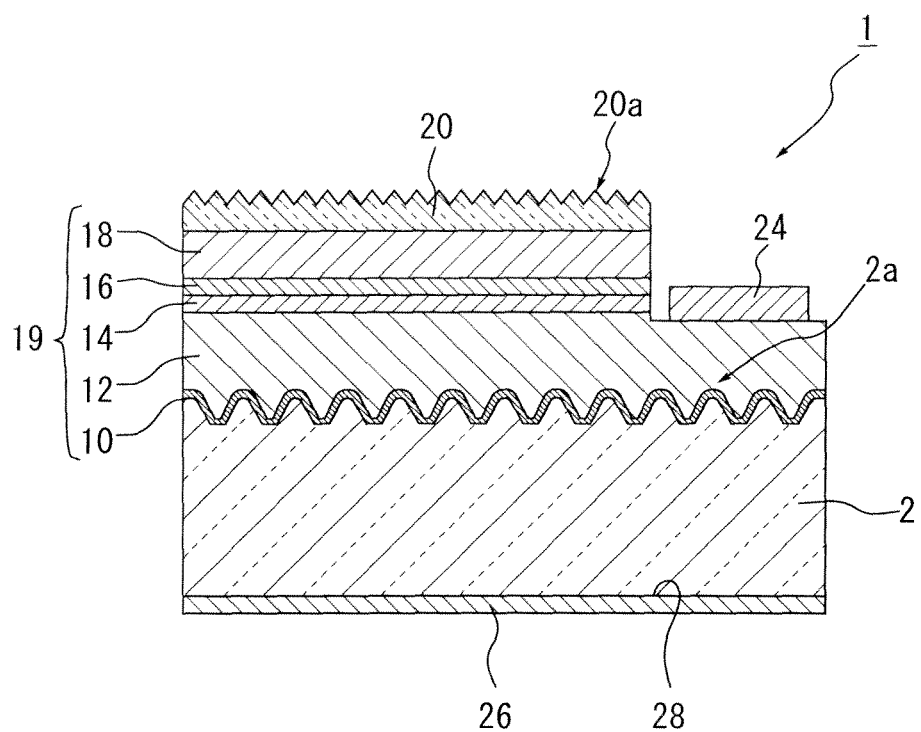
FIG. 6 is a typical cross-sectional drawing of a semiconductor light emitting element of an other embodiment of this invention.

Also, for example, as shown in FIG. 6, a second diffractive face 20a can be formed at a surface of the p-side electrode 20. It is desirable that this concavo-convex period of the diffractive face 20a is also shorter than the coherent length of light emitted from the multiple quantum well active layer 14. In this way, both of diffractive effects can be obtained at the diffractive face 2a of the sapphire substrate 2 and the diffractive face 20a of the p-side electrode 20.

Figure 7:
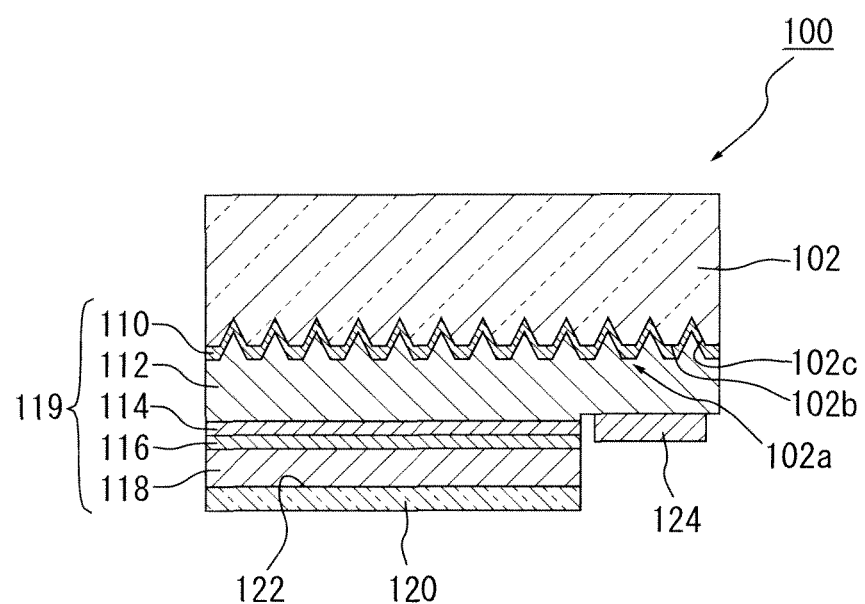
FIG. 7 is a typical cross-sectional drawing of a semiconductor light emitting element of a second embodiment of this invention.

FIG. 7 to FIG. 16 show a second embodiment of this invention and FIG. 7 is a typical cross-sectional drawing of a semiconductor light emitting element.

As shown in FIG. 7, a light emitting element 100 has a semiconductor layer stack part 119 consisting of group-III nitride semiconductor layers, which is formed on a sapphire substrate 102 having a diffractive face 102a. This light emitting element 100 is flip-chip type and light is mainly extracted from aback surface (an upper surface in FIG. 7) of the sapphire substrate 102. The group-III nitride semiconductor layers have a buffer layer 110, an n-type GaN layer 112, a multiple quantum well active layer 114, an electron blocking layer 116 and a p-type GaN layer 118 in this order from the sapphire substrate 102 side. A p-side electrode 120 is formed on the p-type GaN layer 118 and an n-side electrode 124 is formed on the n-type GaN layer 112.

The sapphire substrate 102 has the diffractive face 102a that is C-face ({0001}) a nitride semiconductor grows. A flat part 102b and a plurality of concave portions 102c which are a cone shape and periodically formed in the flat part 102b are formed at the diffractive surface 102a. A shape of each concave portion 102c can be a circular cone, polygonal cone etc. In this embodiment, diffractive effect is obtained by each concave portion 102c which is periodically positioned.

The buffer layer 110 is formed on the diffractive face 102a of the sapphire substrate 102 and consists of GaN. In this embodiment, the buffer layer 110 is grown at lower temperature than the n-type GaN layer 112 etc. described below. The buffer layer 110 has a plurality of convex portions which have a cone shape and are periodically formed along each concave portion 102c at diffractive face 102a side. The n-type GaN layer 112 as a first conductivity type layer is formed on the buffer layer 110 and consists of n-GaN. The multiple quantum well active layer 114 as an emitting layer is formed on the n-type layer 112 and consists of GaNInN/GaN and emits blue light by an injection of electrons and holes. In this document, blue light is, for example, light having peak wavelength of 430 nm or more to 480 nm or less. In this embodiment, the multiple quantum well active layer 114 emits at peak wavelength of 450 nm.

The electron blocking layer 116 is formed on the multiple quantum well active layer 114 and consists of p-AlGaN. The p-type GaN layer 118 as a second type conductivity layer is formed on the electron blocking layer 116 and consists of p-GaN. It is formed by an epitaxial growth of group-III nitride semiconductor from the buffer layer 110 to the p-type layer 118. Although the concave portions 102c are periodically formed on the diffractive face 102a of the sapphire substrate 102, it is planarized by a lateral growth in early phase of growing group-III nitride semiconductor. The semiconductor layer constitution is arbitrary if it contains at least a first conductivity layer, an active layer and a second conductivity layer and the active layer emits by recombination of electrons and holes when applying a voltage between the first conductivity layer and the second conductivity layer.

The p-side electrode 120 is formed on the p-type GaN layer 118, that a p-type GaN layer 118 side face is a reflective face 122. The p-side electrode 120 has high reflection rate of light emitted from the multiple quantum well active layer 114. It is preferable that the p-side electrode 120 has 80% of reflection rate of light emitted from the multiple quantum well active layer 114. In this embodiment, the p-side electrode 120 consists of, for example, material of Ag system, Rh system etc. and is formed by a vacuum evaporation method, sputtering method, CVD (Chemical Vapor Deposition) method etc.

The n-side electrode 124 is formed on the n-type GaN layer 112 exposed by etching the p-type GaN layer 118 to the n-type GaN layer 112. The n-side electrode 124 consists of, for example. Ti/Al/Ti/Au and formed by a vacuum evaporation method, sputtering method, CVD (Chemical Vapor Deposition) method etc.

The sapphire substrate 102 is explained in reference to FIG. 8. FIG. 8 is drawings of a sapphire substrate, and (a) shows a typical perspective drawing and (b) shows a typical explanation drawing of a B-B cross section.

As shown in FIG. 8(a), in planner view, the diffractive face 102a is aligned in intersections of hypothetical triangle grid with a predetermined period so that centers of each concave portion 102c are positioned at equilateral triangle vertices. The period of each concave portion 102c is longer than the optical wavelength of light emitted from the multiple quantum well active layer 114 and shorter than the coherent length of the light. The term "period" means that a distance between peak depth positions of adjacent concave portions 102c. The term "optical wavelength" means that a value actual wavelength is divided by a refraction index. The term "coherent length" corresponds to a distance coherence disappears by counteracting periodic wave oscillation each other caused by differences of individual wavelength in photon group of predetermined spectrum width. When a light wavelength is and a half maximum full-width of the light is $\Delta\lambda$, a coherent length $lc$ is approximately indicated by the following formula: $lc=\lambda^2/\Delta\lambda$). It is preferable that the period of each concave portion 102c is longer than twice the optical wavelength of light emitted from the multiple quantum well active layer 114. It is preferable that the period of each concave portion 102c is equal to or shorter than a half of the coherent length of light emitted from the multiple quantum well active layer 114.

In this embodiment, the period of each concave portion 102c is 500 nm. Since a wavelength of light emitted from the active layer 114 is 450 nm and a refraction index of group-III nitride semiconductor is 2.4, the optical wavelength is 187.5 nm. Also, since a half maximum full-width of the light emitted from the active layer 114 is 63 nm, the coherent length of the light is 3214 nm. The period of the diffractive face 102a is longer than twice the optical wavelength of light emitted from the active layer 114 and equal to or shorter than a half of the coherent length of the light.

In this embodiment, as shown in FIG. 8(b), each concave portion 102c of the diffractive face 102a is formed in a circular cone shape. Concretely, each concave portion 102c has a base end section whose diameter is 200 nm, and the depth of each concave portion 102c is 250 nm. The diffractive face 102a of the sapphire substrate 102 is the flat part 102b except each concave portion 102c and a lateral growth of semiconductor layer is assisted.

Figure 9:
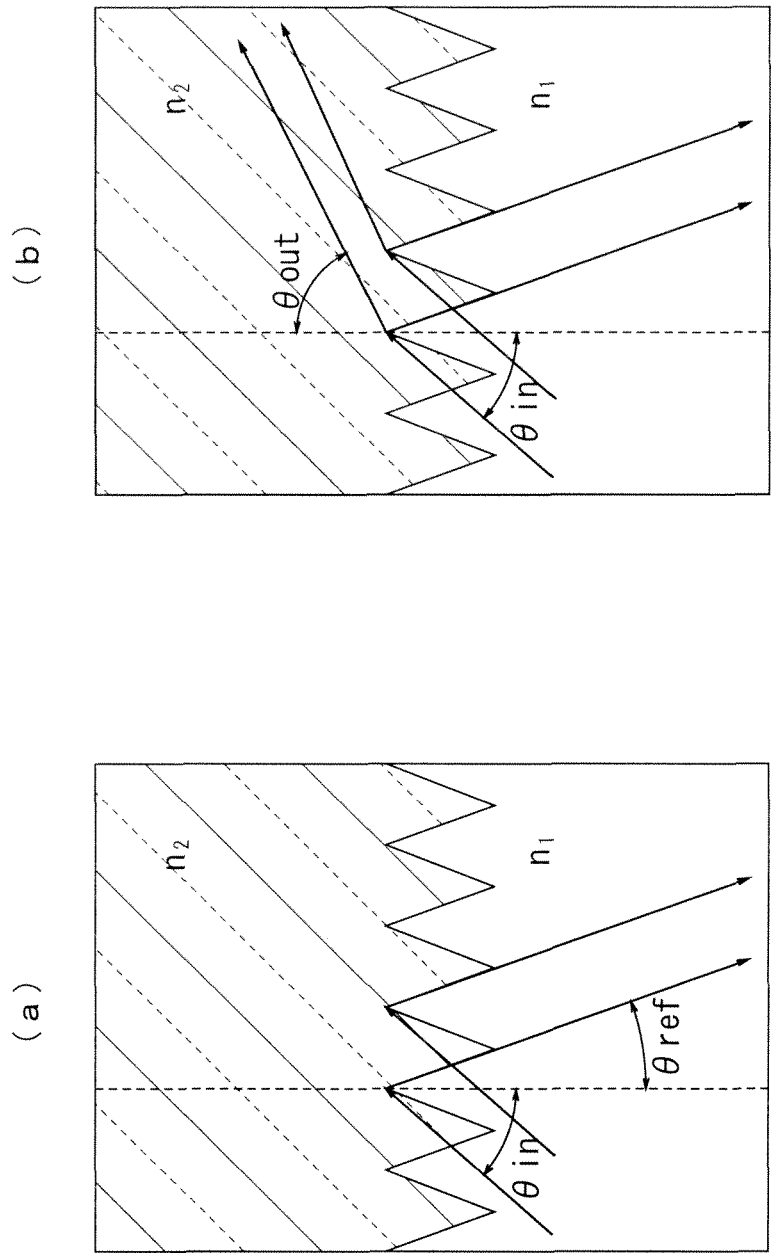
FIG. 9 is an explanation drawing of a diffractive effect of light at an interface of different refractive indices, and (a) shows reflected light at an interface and (b) shows transmitted light at an interface.

FIG. 9 is an explanation drawing of a diffractive effect of light at an interface of different refractive indices, and (a) shows reflected light at an interface and (b) shows transmitted light at an interface.

In case of reflected light at an interface, according to Bragg's condition of diffraction, an incident angle $\theta_{in}$ and reflection angle $\theta_{ref}$ meet the condition below:

$$d \cdot n1 \cdot (\sin \theta_{in} - \sin \theta_{ref}) = m \cdot \lambda \quad (1)$$

Where n1 is refraction index of incident side medium, k is a wavelength of incident light and m is an integer. In this embodiment, n1 is refraction index of group-III nitride semiconductor. As shown in FIG. 9(a), light being incident to the interface is reflected in the reflection angle $\theta_f$ which meets the above formula (1).

On the other hand, in case of transmitted light at an interface, according to Bragg's condition of diffraction, an incident angle $\theta_{in}$, and transmission angle $\theta_{ref}$ meet the condition below:

$$d \cdot (n1 \cdot \sin \theta_{in} - n2 \cdot \sin \theta_{out}) = m' \cdot \lambda \quad (2)$$

Where n2 is refraction index of output side medium and m' is an integer. In this embodiment, n2 is refraction index of the sapphire substrate 2. As shown in FIG. 9(b), light being incident to the interface is transmitted in the transmission angle $\theta_{out}$ which meets the above formula (2).

In order for existence of the reflection angle $\theta_{ref}$ and the transmission angle $\theta_{out}$ meets the above (1) formula and (2) formula, the period of the diffractive face 102a should be longer than ($\lambda$/n1) and ($\lambda$/n2) which are the optical wavelength of inside of an element. A well known moth-eye structure is designed that a period is shorter than ($\lambda$/n1) and ($\lambda$/n2) and diffractive light does not exist. The period of diffractive face 102a should be shorter than the coherent length that light keep the wave nature and is preferable to be equal to or less than a half of the coherent length. The light being equal to or less than a half of the coherent length secures the strength of reflection light and transmission light by diffractive effect.

Figure 10:
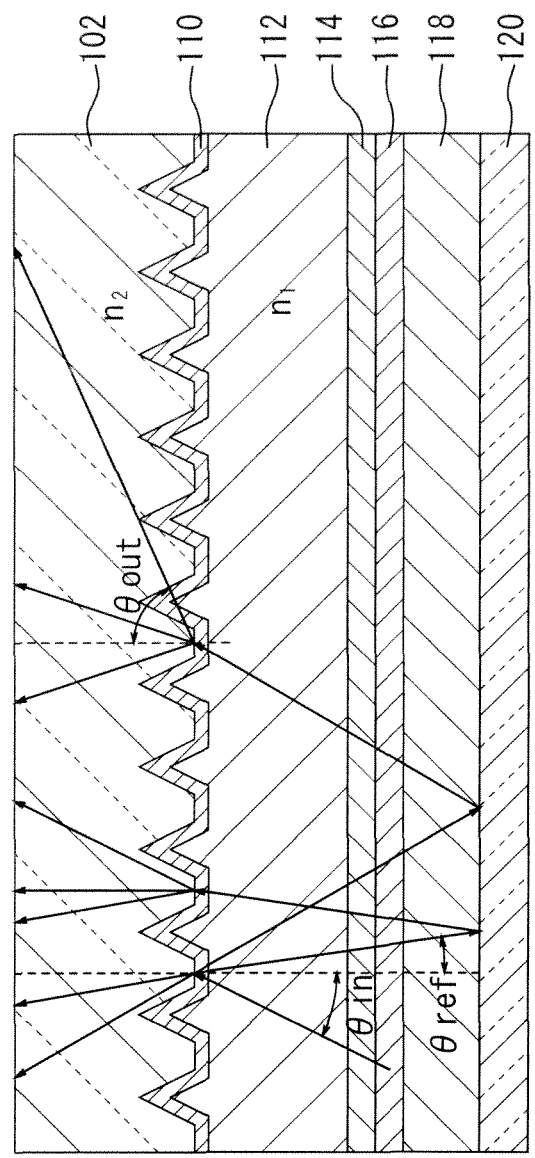
FIG. 10 is an explanation drawing of a diffractive effect of light being incident to a sapphire substrate from a group-III nitride semiconductor.

FIG. 10 is an explanation drawing of a diffractive effect of light being incident to a sapphire substrate from a group-III nitride semiconductor.

As shown in FIG. 10, light being incident to the sapphire substrate 102 at the incident angle $\theta_{in}$, of light isotopic radiated from the multiple quantum well active layer 114 in the light emitting element 100, is reflected at the reflection angle $\theta_{ref}$ which meets the above formula (1) and is transmitted at the transmission angle $\theta_{out}$ which meets the above formula (2). If the incident angle $\theta_{in}$ is equal to or more than the total reflection optimal angle, the strength of reflection light is larger. The reflection light is reflected at the reflection face 122 of the p-side electrode 120 and is incident to the moth-eye face 102a again. However, since the reflection light is incident at a different angle from the former incident angle $\theta_{in}$, the reflection light has a different transmission property from the former incident condition.

Figure 11:
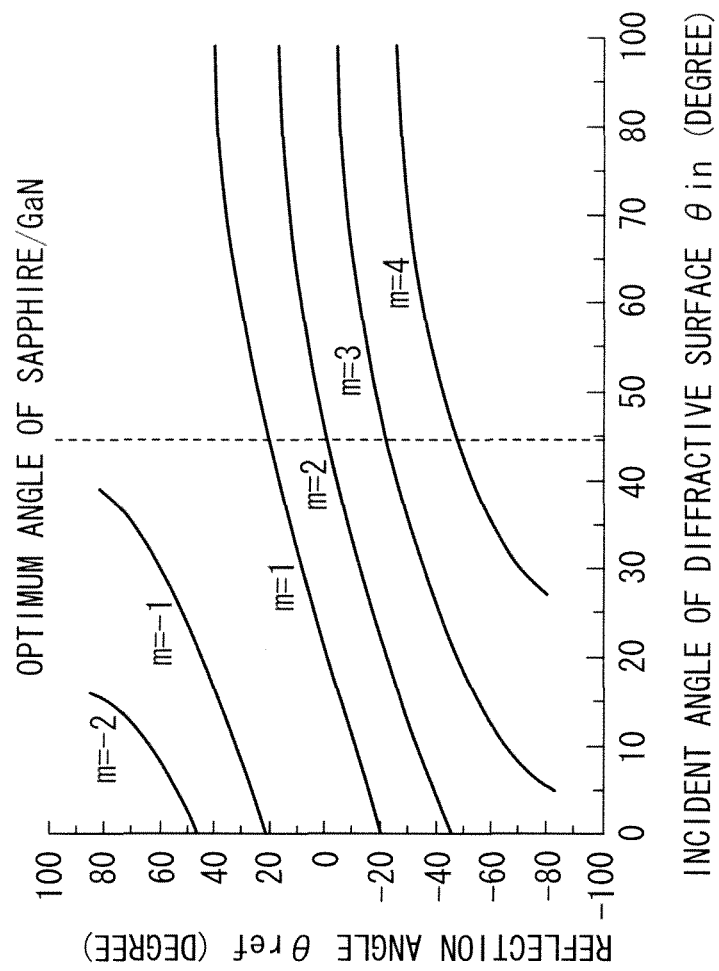
FIG. 11 is a graph showing a relationship between an incident angle of light being incident to an interface from semiconductor layer side and a reflecting angle of light at an interface by a diffractive face, at an interface of a group-III nitride semiconductor and a sapphire substrate in case that a period of concave portions or convex portions is 500 nm.

FIG. 11 is a graph showing a relationship between an incident angle of light being incident to an interface from semiconductor layer side and a reflecting angle of light at an interface by a diffractive face, at an interface of a group-III nitride semiconductor and a sapphire substrate in case that a period of concave portions or convex portions is 500 nm.

Figure 5:
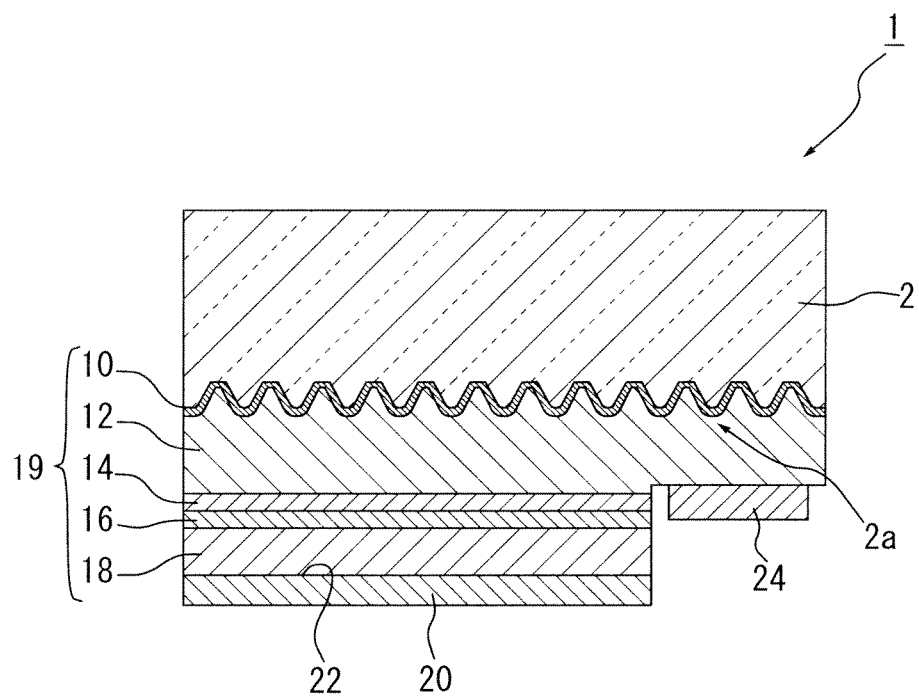
FIG. 5 is a typical cross-sectional drawing of a semiconductor light emitting element of an other embodiment of this invention.

In light being incident to the diffractive face 102a, the total reflection optimal angle exists as well as a general flat face. The optimal angle is about 45 degree at an interface of GaN system semiconductor layer and the sapphire substrate 102. As shown in FIG. 5, in the area that the incident angle $\theta_{in}$ is over 45 degree, transmission in diffractive modes of (m=1, 2, 3, 4) which meets the above formula (2) is possible. In case that the outside is air, the optimal angle at an interface of the sapphire substrate 102 and air is about ±34 degree and available diffractive modes are (m=2, 3) in this case.

Figure 12:
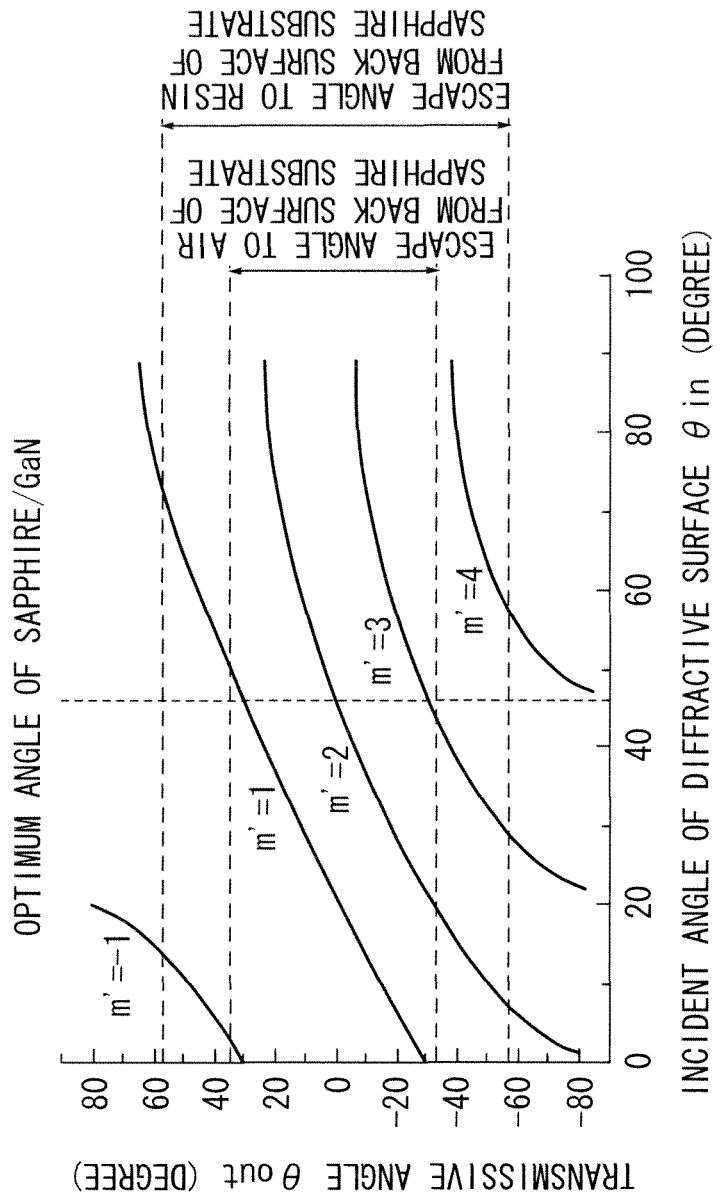
FIG. 12 is a graph showing a relationship between an incident angle of light being incident to an interface from semiconductor layer side and a transmission angle of light at an interface by a diffractive surface, at an interface between a group-III nitride semiconductor and a sapphire substrate in case that a period of concave portions or convex portions is 500 nm.

FIG. 12 is a graph showing a relationship between an incident angle of light being incident to an interface from semiconductor layer side and a transmission angle of light at an interface by a diffractive surface, at an interface between a group-III nitride semiconductor and a sapphire substrate in case that a period of concave portions or convex portions is 500 nm.

As shown in FIG. 12, in the area that the incident angle $\theta_{in}$ is over 45 degree, reflection in diffractive modes of (m=1, 2, 3, 4) which meets the above formula (1) is possible. Reflective light reflected in these modes is reflected at the reflective face 122 of the p-side electrode 120 and is incident to the diffractive face 102a again. The incident angle $\theta_{in}$ at that time keeps an angle previously reflected at the diffractive face 102a and is diffracted again by the second time incidence.

Figure 13:
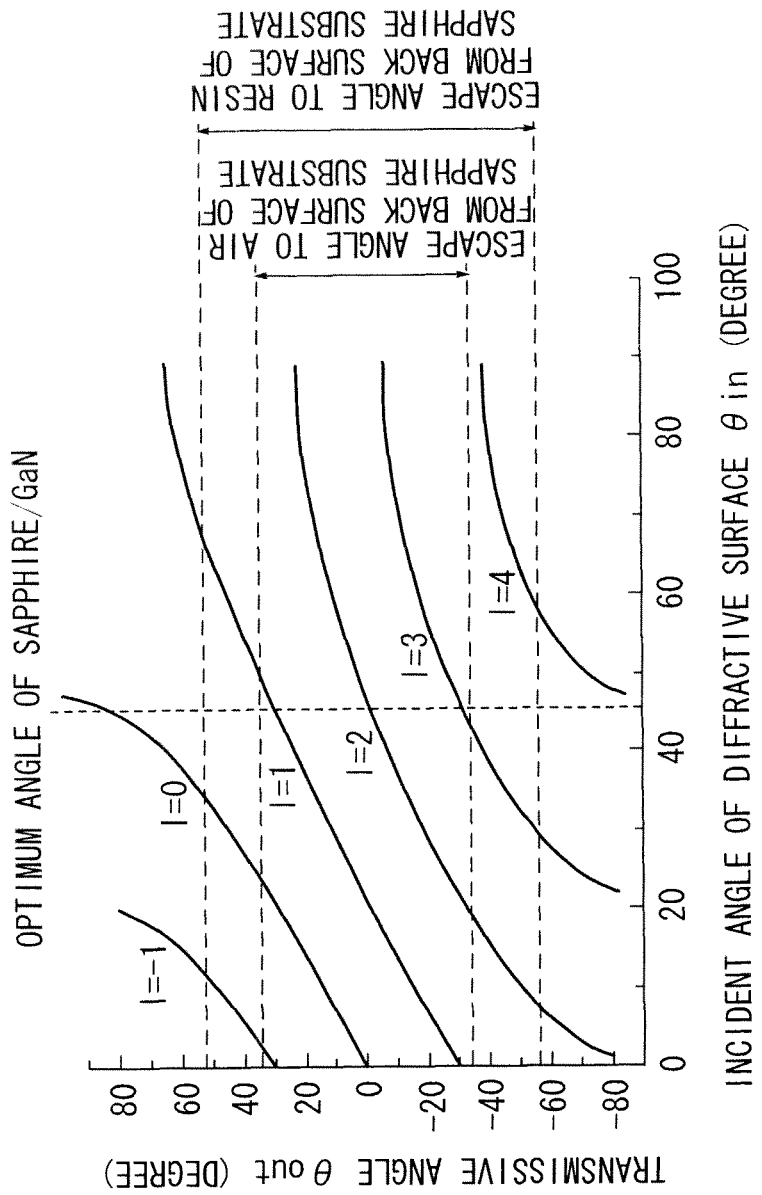
FIG. 13 is a graph showing a relationship between an incident angle of light entering an interface from semiconductor layer side for the first time and a transmission angle of light being incident to for the second time after reflected by a diffraction effect, at an interface by a diffractive face, at an interface of a group-III nitride semiconductor and a sapphire substrate in case that a period of concave portions or convex portions is 500 nm.

FIG. 13 is a graph showing a relationship between an incident angle of light entering an interface from semiconductor layer side for the first time and a transmission angle of light being incident to for the second time after reflected by a diffraction effect, at an interface by a diffractive face, at an interface of a group-III nitride semiconductor and a sapphire substrate in case that a period of concave portions or convex portions is 500 nm.

In FIG. 13, mode index l about transmission of light being incident for the second time is defined a sum of mode index m about reflection for the first incident time and mode index m' about transmission for the second incident time, and that is to say l=m+m'. The mode index l about transmission of light being incident for the second time has the same transmission property as long as the mode index l is same, if the mode index m about reflection for the first incident time and the mode index m' about transmission for the second incident time are any value. Although (m'=0) is not acceptable in light transmission property for the first incident time, (l=0) is acceptable in light transmission property for the second incident time. For example, in case of (l=1), five modes of (m, m')=(2, −1), (3, −2), (4, −3), (−1, 2), (−2, 3) exist. In that to say, the light strength at an angle of transmission light in (l=1) is relatively large. If the period of the diffractive face 102a is infinitely shorter than the coherent length, increases of light extracted by a diffractive effect is five times that by adding the p-side electrode 120 made of high reflective material.

In this way, incident light having an angle over the total reflection optimal angle at the interface of the sapphire substrate 102 and a group-III nitride semiconductor can be extracted to the outside of element by using a diffractive effect since it comprises the diffractive face 102a having the concave portions 102c that the period is longer than the optical wavelength of light emitted from the multiple quantum well active layer 114 and shorter than the coherent length of the light, and the reflective face 120 which reflects light diffracted at the diffractive face 102a and let the reflected light be incident to the diffractive face 102a again. In this embodiment, since light is extracted by a diffractive effect, a different effect from the one that light is extracted by scattering effect is obtained and a light extraction efficiency of the light emitting element 100 can be highly improved.

Especially in this embodiment, since the active layer 114 as a light emitting layer is sandwiched between the diffractive face 102a and the reflective face 120, the reflective angle $\theta_{ref}$ different from the incident angle $\theta_{in}$ at the diffractive face 102a can be incident at the former incident angle $\theta_{in}$. In this way, since light is incident to the diffractive face 102a in different condition for the first time and second condition, many transmission modes exist and it has an advantage in the light extraction.

Furthermore, in this embodiment, refractive index of group-III nitride semiconductor is 2.4 and refractive index of sapphire is 1.8, thus, the diffractive face 102a is formed at an interface of materials whose refractive index difference is equal to or more than 0.5. If refractive index difference is equal to or more than 0.5, the light extraction is relatively disadvantageous. However, light can be adequately extracted from the light emitting element 100, it has an advantage in actual use.

Figure 14:
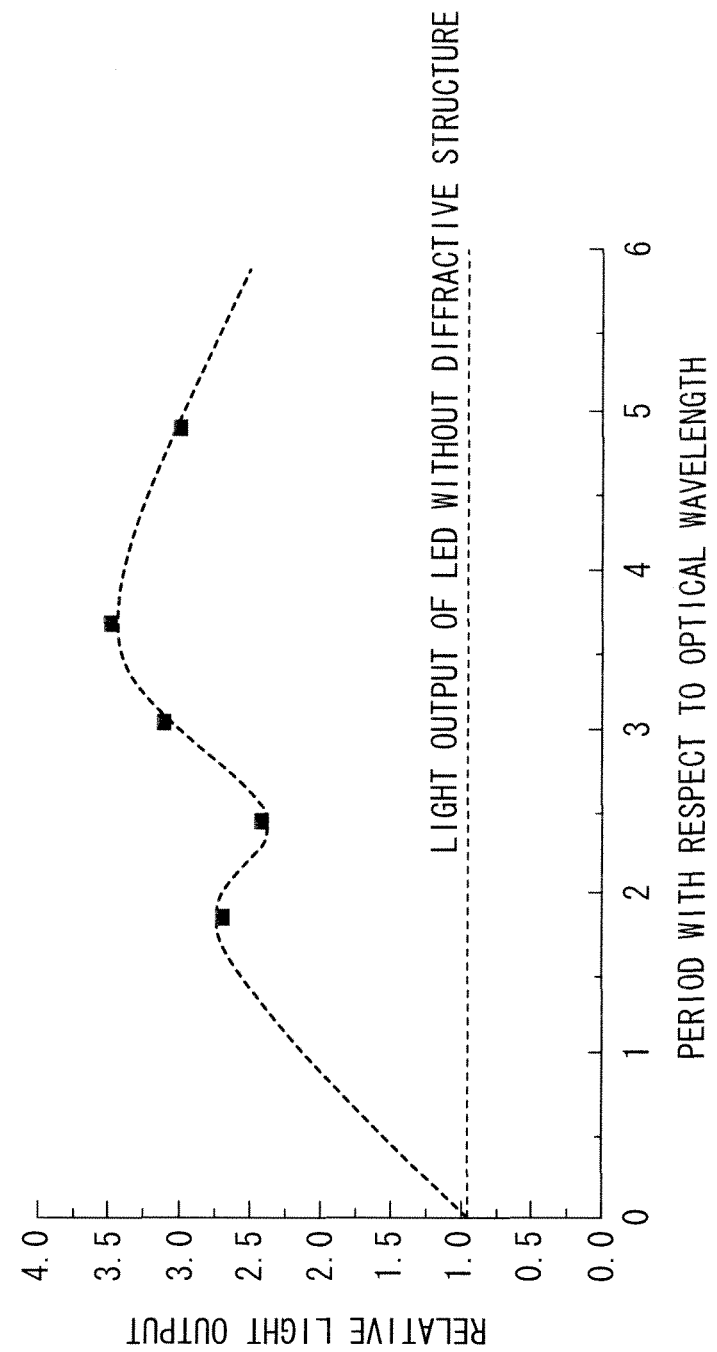
FIG. 14 is a graph showing a relationship between a period of a diffractive face and a relative light output in case that an optical wavelength is 258 nm and a diffractive face is provided at an interface of a sapphire substrate and group-III nitride semiconductor layer.

A relationship between a period of a diffractive face and relative light output of element is explained in reference to FIG. 14. FIG. 14 is a graph showing a relationship between a period of a diffractive face and a relative light output in case that an optical wavelength is 258 nm and a diffractive face is provided at an interface of a sapphire substrate and group-III nitride semiconductor layer. In the relative light output, an output that an interface of a sapphire substrate and group-III nitride semiconductor layer is a flat face is 1.0. In FIG. 14, data are obtained by applying an electrical current to a chip of 1.0 mm squares at room temperature in a condition with a distance of the active layer to the diffractive face is 3.0 μm and a distance of the diffractive face to the back side of the sapphire substrate is 100 μm. Also, one amount of the relative light output corresponds to 40 mW.

As shown in FIG. 14, in the area that the period of the diffractive face is equal to or less than one amount of the optical wavelength, a light extraction efficiency increases by suppressing Fresnel reflection at an angle which is equal to or less than the total the total reflection optimal angle. In the area that the period of the diffractive face is more than one amount of the optical wavelength and is equal to or less than twice the optical wavelength, a light extraction efficiency increases since both a diffraction effect and a suppressing Fresnel reflection effect can be obtained. In the area that the period of the diffractive face is more than twice the optical wavelength and is equal to or less than two-and-a-half times of the optical wavelength, a light extraction efficiency slightly decreases since a suppressing Fresnel reflection effect disappears. In the area that the period of the diffractive face is more than two-and-a-half times of the optical wavelength, a light extraction efficiency increases again since incident light which meets the diffraction condition increases. In the area that the period of the diffractive face is more than two-and-a-half times of the optical wavelength, a light extraction efficiency increases again since incident light which meets the diffraction condition increases. In the area that the period of the diffractive face is equal to or more than three times of the optical wavelength and is equal to or less than five times of the optical wavelength, a light extraction efficiency is equal to or more than three times of a flat face. Although FIG. 14 illustrates up to about six times of the optical wavelength concerning the period, the light output is about twice the output of a flat face when the period is a half of the coherent length and the light output is about 1.8 times output of a flat face when the period is equal to the coherent length. The reason why the output is larger than a flat face even in the coherent length is to be able to obtain a scattering effect by concave portions or convex portions. In this way, a diffractive effect can be obtained when the period exceeds one amount of the optical wavelength and it is understood that the light output of the light emitting element 100 highly increases when exceeding two-and-a-half times of the optical wavelength.

A method for manufacturing the sapphire substrate 102 for he light emitting element 100 is explained in reference to FIG. 15 and FIG. 16. FIG. 15 is an explanation drawing for processing a sapphire substrate, and (a) shows a substrate that a first mask layer is formed on a diffractive surface, (b) shows a substrate that a resist layer is formed on a first mask layer, (c) shows a substrate that an electron beam is selectively irradiated to a resist layer, (d) shows a substrate that a resist mask is developed and removed, (e) shows a substrate that a second mask layer is formed.

First, as shown in FIG. 15(a), a sapphire substrate 102 shaped like a flat plate is prepared and a first mask layer 130 is formed on the main surface of the sapphire substrate 102. The first mask layer 130 consists of, for example, $SiO_2$ and formed by a sputtering method, vacuum evaporation method, CVD method etc. The thickness of the first mask layer 130 is arbitrary and, for example, it is 1.0 μm.

For example, in case that the first mask layer 130 is formed by a magnetron sputtering system, Ar gas and high-frequency (RF) power source can be used. Concretely, for example, the first mask layer 130 of 600 nm can be formed in condition that Ar gas is 25 sccm and the power of the RF power source is 200-500 W in accordance with material. Sputtering time can be arbitrary adjusted at that time.

Next, as shown in FIG. 15(b), a resist layer 132 is formed on the first mask layer 130 of the sapphire substrate 102. The resist layer 132 consists of, for example, electron beam sensitive material of ZEP etc. manufactured by Japan Zeon Corporation and is applied on first mask layer 130. The thickness of the resist layer 132 is arbitrary and, for example, 100 nm to 2.0 μm.

For example, in case that the resist layer 132 is formed by spin coating, the resist mask layer 132 of thickness of 160-170 nm can be obtained by baking for four minutes at 180° C. after a uniform thickness film is formed in condition with rotating speed of spinner of 1500 rpm. Concretely, ZEP manufactured by Japan Zeon Corporation and diluting fluid of ZEP-A manufactured by Japan Zeon Corporation which are mixed in a ratio 1:1.4 can be uses as material of the resist layer 132.

Next, as shown in FIG. 3(c), a stencil mask 134 is set with a clearance from the resist mask 132. The clearance between the resist mask 132 and the stencil mask 134 is 1.0 μm to 100 μm. The stencil mask 134 consists of, for example, material such as diamond, SiC etc. The thickness of the stencil mask 134 is arbitrary and, for example, 500 nm to 100 μm. The stencil mask 134 has apertures 134a that electron beam transmits selectively.

The stencil mask 134 is formed a thin plate shape having constant thickness and it is possible that the thickness is partially thick, for example, by providing a lattice-shaped or line-shaped thick part in order of giving a strength. In this embodiment, concave portions 102c which correspond to a plurality of the light emitting element 100 is formed on sapphire substrate 102 shaped a wafer and a plurality of the light emitting elements 100 are manufactured by dicing it after an epitaxial growth of group-III nitride semiconductor. Thus, the thick part of the stencil mask 134 can be formed in corresponding a passing position of a dicing blade. The thick part may project to sapphire substrate 102 side, opposite side of the sapphire substrate 102, or both sides. In case of projecting to the sapphire substrate 102 side, contacting a top edge of the thick part to the resist layer 132 gives spacer function to the thick part.

After that, as shown in FIG. 15(c), an electron beam is irradiated to the stencil mask 134 and the resist layer 132 is exposed to an electron beam transmitting the apertures 134a of the stencil mask 134. Concretely, a pattern of the stencil mask 134 is printed to the resist layer 132, for example, by using an electron beam of 10-100 μC/cm². An electron beam is irradiated a spot shape to the stencil mask 134 and, in actuality by scanning an electron beam, an electron beam is irradiated to a whole surface of the stencil mask 134. The resist layer 132 is positive type and solubility to developing solution increases when exposed. The resist layer 132 may be negative type. Although solvent included in the resist layer 132 volatilizes when the resist layer 132 is exposed, volatilization components are easy to diffuse by the clearance between the resist layer 132 and the stencil mask 134 and it is prevented that the stencil mask 134 is polluted by the volatilization components.

After an electron beam has been irradiated, the resist layer 132 is developed by using predetermined developing fluid. In this way, as shown in FIG. 15(d), a part that an electron beam irradiated is eluted in the developing fluid and a part that an electron beam did not irradiate stays, thus, apertures 132a are formed. In case of using ZEP manufactured by Japan Zeon Corporation as the resist layer 132, for example, amyl acetate can be used as the developing fluid. It is arbitrary whether or not cleaning it by rinse fluid after developing, in case of using ZEP manufactured by Japan Zeon Corporation as the resist layer 132, for example, IPA (isopropyl alcohol) can be used as the rinse fluid.

Next, as shown in FIG. 15(e), a second mask layer 136 is formed on the first mask layer 130 that the resist layer 132 is patterned. In this way, the second mask layer 132 is patterned on the first mask layer 130 by electron beam irradiation. The second mask layer 136 consists of, for example, Ni and formed by a sputtering method, vacuum evaporation method, CVD method etc. The thickness of the second mask layer 136 is arbitrary and, for example, it is 20 nm. The second mask layer can be formed by, for example, a magnetron sputtering system as well as the first mask layer.

FIG. 16 is an explanation drawing for processing a sapphire substrate, and (a) shows a substrate that a resist layer is completely removed, (b) shows a substrate that a first layer is etched by using a second mask layer as a mask, (c) shows a substrate that a second mask layer is removed, (d) shows a substrate that a diffractive face etched by using a first mask layer as a mask and (e) shows a substrate that a first mask layer is removed.

As shown in FIG. 16(a), the resist layer 132 is removed by using parting agent. For example, it can be removed in condition that the resist layer 132 is soused in the parting agent and ultrasonic wave is irradiated for predetermined time. Concretely, for example, diethyl ketone can be used as parting agent. It is arbitrary whether or not cleaning it by rinse fluid after removing the resist layer 132, for example, acetone, methanol etc. can be used as the rinse fluid. In this way, a pattern of the second mask layer 136 that has a shape the pattern of apertures 134a of the stencil mask 134 is inverted is formed on the first mask layer 130.

As shown in FIG. 16(b), the first mask layer 130 is dry-etched by using the second mask layer 136 as a mask, In this way, apertures 130a are formed in the first mask layer 130 and a pattern of the first mask layer 130 is formed. At that time, etching gas having tolerance that the sapphire substrate 102 and the first mask layer 130 are larger than the second mask layer 136 is used. For example, in case that the first mask layer 130 is $SiO_2$ and the second mask layer 136 is Ni, if fluorine series gas is used, the pattern of the first mask layer 130 can be formed with precision since Ni has etching selectivity of about 100 to $SiO_2$.

After that, as shown in FIG. 16(e), the second mask layer 136 on the first mask layer 130 is removed. In case that the first mask layer 130 is $SiO_2$ and the second mask layer 136 is Ni, Ni can be removed by sousing in hydrochloric acid and nitric acid which are mixed in a ratio 1:1 and diluted with water or dry-etching using argon gas.

After that, as shown in FIG. 16(d), the sapphire substrate 102 is dry-etched by using the first mask layer 130 as a mask. At that time, a reverse pattern of apertures 134a of the stencil mask 134 is transcribed on the sapphire substrate 102, since only a part that the first mask layer 130 is removed in the sapphire substrate 102 is exposed to etching gas. At that time, a part which is not covered by the first mask layer 130 can be etched selectively since the first mask layer 130 has larger tolerance to the etching gas than the sapphire substrate 102. The etching is finished when an etching depth of the sapphire substrate 102 reaches the predetermined depth. In this embodiment, although the apertures 130a transcribed on the first mask layer 130 in early phase of etching has a diameter of 50 nm, since side etching is progressed with progression of etching in depth direction, the concave portion 102c having a circular cone shape that the diameter of the base end section is 150 nm is finally formed. In this embodiment, contact points of the first mask layer 130 and the sapphire substrate 102 is lost with progression of etching and the first mask layer 130 is removed from an outside edge. For example, chlorine series gas such as $BCl_3$ etc. is used as the etching gas. In case of the combination of the first mask layer 130 and the etching gas without side etching, a reverse pattern of apertures 134a of the stencil mask 134 is designed so that the shape is same as the base end section of each concave portion 102c.

After that, as shown in FIG. 16(e), the first mask layer 130 left on the sapphire substrate 102 is removed by using predetermined parting agent. For example, in case that the first mask layer 130 is $SiO_2$, dilute hydrofluoric acid can be used as parting agent.

A group-III nitride semiconductor is epitaxially grown by using a lateral growth on the diffractive face 102a of the sapphire substrate 102 as made above and the light emitting element 100 is manufactured by dividing to a plurality of the light emitting element 100 by dicing after forming each electrode.

In the light emitting element 100 manufactured by the above processes, although the concave portions 102c are formed on the diffractive face 102a of the sapphire substrate 102, since an end of dislocations is generated when the group-III nitride semiconductor is planarized by a lateral growth, crystal which has a relatively low dislocation density is obtained in the group-III nitride semiconductor. As a result, crystal has a relatively low dislocation density in the multiple quantum well active layer 114 and the emission efficiency does not decrease by forming the concave portion 102c at the diffractive face 102a.

The light emitting wavelength of the active layer 114 and the period of the diffractive face 102a in the above embodiment are arbitrary, in case that the active layer 114 emits blue light, a high light extraction efficiency can be obtained when the period of the diffractive face 102a is equal to or more than 300 nm and equal to or less than 1500 nm.

In the above embodiment, although it shows that the light emitting element 100 is flip-chip type, for example, as shown in FIG. 17, the light emitting element 100 can be face-up type. The light emitting element 200 in FIG. 17 has a buffer layer 210, an n-type GaN layer 212, a multiple quantum well active layer 214, an electron blocking layer 216 and a p-type GaN layer 218 in this order on the sapphire substrate 202, and a p-side transparent electrode 220 consisting of, for example, ITO (Indium Tin Oxide) is formed on the p-type GaN layer 218 and n-side electrode 224 is formed on the n-type GaN layer 212. A reflective film 226 consisting of, for example, Al is formed on the back side of the sapphire substrate 202. In this light emitting element 200, a face at the sapphire substrate 200 side of the reflective film 226 is a reflective face 228 and light emitted from the active layer 214 is transmitted through the diffractive face 202a by a diffractive effect and transmitted light is reflected at the reflective face 228. In this way, light can be extracted in multimode since light which is transmitted by a diffractive effect is incident to the diffractive face 202a and is transmitted through the diffractive face 202a again by a diffractive effect at the diffractive face 202a.

Figure 18:
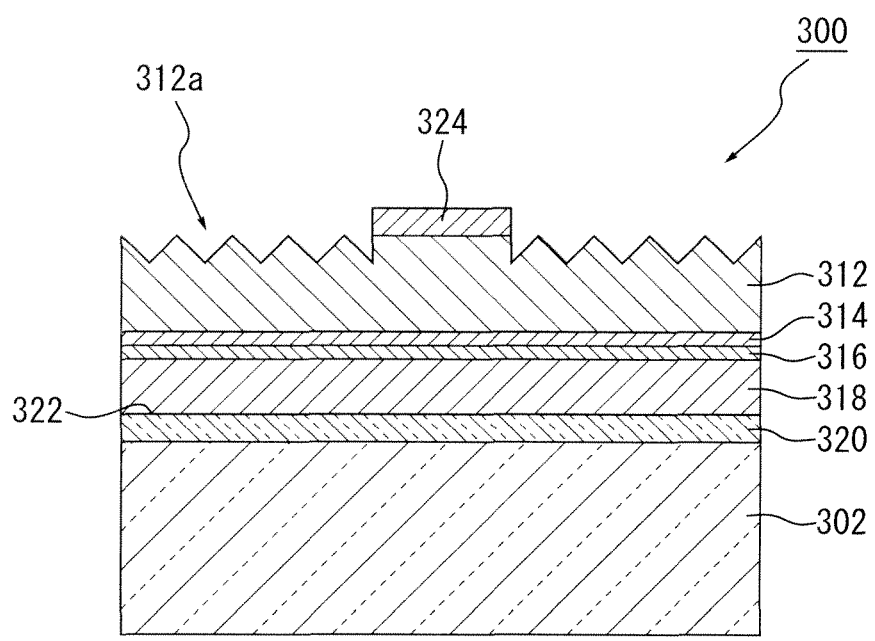
FIG. 18 is a typical cross-sectional drawing of a semiconductor light emitting diode element of an other embodiment of this invention.

Also, in the above embodiment, the diffractive face 102a is formed at an interface of the sapphire substrate 102 and group-III nitride semiconductor, for example, as shown in FIG. 18, a diffractive face 312a can be formed at a surface of light emitting element 300. The light emitting element 300 is a thin-film-type light emitting diode and has a p-side electrode 320, a p-type GaN layer 318, an electron blocking layer 316, a multiple quantum well active layer 314 and an n-type GaN layer 312 in this order on a conductive substrate 302. A n-type electrode 324 is formed on the center of the surface of the n-type GaN layer 312 and a part of not forming the n-type electrode 324 on the n-type GaN layer 312 is a surface of element and the diffractive face 312a is formed on this part. In this light emitting element 300, the diffractive face 312a and the reflective face 322 of the p-side electrode 320 are arranged opposite side sandwiching the active layer 314. In this light emitting element 300 has the diffractive face 312a which is an interface of the n-type GaN layer 312 and medium of outside of element and a diffractive effect can be obtained at this interface.

Figure 19:
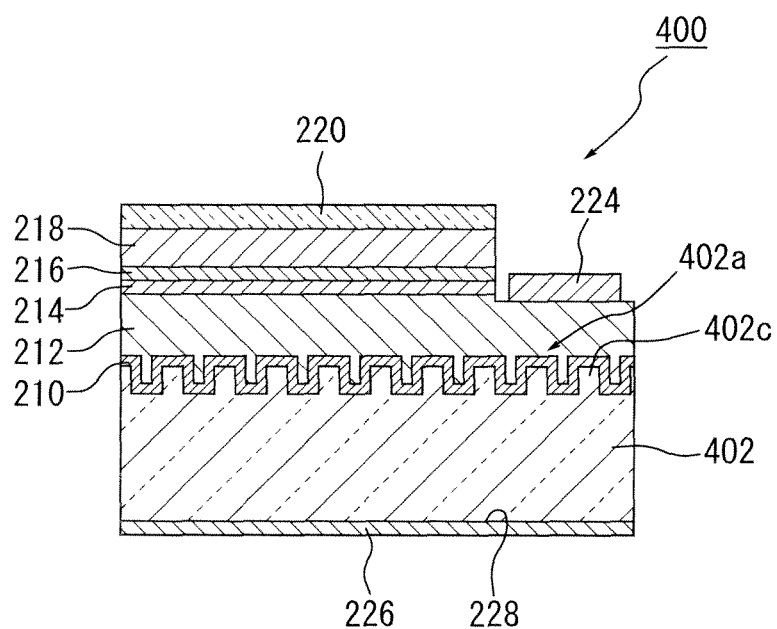
FIG. 19 is a typical cross-sectional drawing of a semiconductor light emitting diode element of an other embodiment of this invention.

Also, in the above embodiment, although a plurality of concave portions 102c are formed at the diffractive face 102a, for example, as shown in FIG. 19, a plurality of convex portions 402c can be formed at the diffractive face 402a of the sapphire substrate 402. The light emitting element 400 in FIG. 19 that the diffractive face 402a of the light emitting element 200 in FIG. 17 is modified has convex portions 402c which are aligned in intersections of hypothetical square grid with a predetermined period. Also, concave portions or convex portions can be formed a polygonal cone such as a triangular cone or square cone, and other concrete detail structures can be changed arbitrarily Industrial Applicability Since the semiconductor light emitting element of the present invention increases the light extraction efficiency, it is useful industrially.

Reference Signs List
1 Light emitting element
2 Sapphire substrate
2a Diffractive face
2b Flat part
2c Convex portion
2d Side surface
2e Curved portion
2f Upper surface
10 Buffer layer
12 n-type GaN layer
14 Multiple quantum well active layer
16 Electron blocking layer
18 p-type GaN layer
20 p-side electrode
20a Diffractive face
22 Reflective face
24 n-side electrode
26 Reflective film
28 Reflective face
30 First mask layer
30a Aperture
32 Resist layer
32a Aperture
34 Stencil mask
34a Aperture
36 Second mask layer
100 Light emitting element
102 Sapphire substrate
102a Diffractive face
102b Flat part
102c Concave portion
110 Buffer layer
112 n-type GaN layer
114 Multiple quantum well active layer
116 Electron blocking layer
118 p-type GaN layer
119 Semiconductor layer stack part
120 p-side electrode
122 Reflective face
124 n-side electrode
130 First mask layer
130a Aperture
132 Resist layer
132a Aperture
134 Stencil mask
134a Aperture
136 Second mask layer
200 Light emitting element
202 Sapphire substrate
202a Diffractive face
210 Buffer layer
212 n-type GaN layer
214 Multiple quantum well active layer
216 Electron blocking layer
218 p-type GaN layer
220 p-side transparent electrode
224 n-side electrode
226 Reflective film
228 Reflective face
300 Light emitting element
302 Conductive substrate
310 Buffer layer
312 n-type GaN layer
312a Diffractive face
314 Multiple quantum well active layer
316 Electron blocking layer
318 p-type GaN layer
320 p-side electrode
322 Reflective face
400 Light emitting element
402a Diffractive face
402c Convex portion

The invention claimed is:

1. A semiconductor light emitting element, comprising;
a semiconductor stack part that includes a light emitting layer;
a diffractive face that light emitted from the light emitting layer is incident to;
convex portions or concave portions formed in a period which is longer than an optical wavelength of the light and is shorter than a coherent length of the light, wherein the diffractive face reflects incident light in multimode according to Bragg's condition of diffraction and transmits the incident light in multimode according to the Bragg's condition of diffraction; and
a reflective face which reflects multimode light diffracted at the diffractive face and let the multimode light be incident to the diffractive face again,
wherein the semiconductor stack part is formed on the diffractive face, and
wherein the convex portions or the concave portions include a side surface and a curved portion which curves and extends to a center side of the convex portions or the concave portions from an upper end of the side surface.

2. The semiconductor light emitting element according to claim 1, wherein the period of the convex portions or the concave portions is longer than twice the optical wavelength.

3. The semiconductor light emitting element according to claim 1, wherein the period of the convex portions or the concave portions is equal to or less than a half of the coherent length.

4. The semiconductor light emitting element according to claim 1, wherein the light emitting layer emits blue light and the period is equal to or more than 300 nm and is equal to or less than 1500 nm.

5. The semiconductor light emitting element according to claim 1, wherein the diffractive face is provided at an interface of materials whose diffractive index difference is equal to or more than 0.5.

6. A method for manufacturing the semiconductor light emitting element according to claim 1, said method including:
    forming the convex portions or the concave portions, which include a corner formed at an intersection of the side surface with the upper surface, on a diffractive face; and
    forming the curved portion by rounding off the corner by etching.

7. The semiconductor light emitting element according to claim 3, wherein the period of the convex portions or the concave portions is equal to or less than a half of the coherent length.

8. The semiconductor light emitting element according to claim 2, wherein the light emitting layer emits blue light and the period is equal to or more than 300 nm and is equal to or less than 1500 nm.

9. The semiconductor light emitting element according to claim 3, wherein the light emitting layer emits blue light and the period is equal to or more than 300 nm and is equal to or less than 1500 nm.

10. The semiconductor light emitting element according to claim 2, wherein the diffractive face is provided at an interface of materials whose diffractive index difference is equal to or more than 0.5.

11. The semiconductor light emitting element according to claim 3, wherein the diffractive face is provided at an interface of materials whose diffractive index difference is equal to or more than 0.5.

12. The semiconductor light emitting element according to claim 4, wherein the diffractive face is provided at an interface of materials whose diffractive index difference is equal to or more than 0.5.

13. A method for manufacturing the semiconductor light emitting element according to claim 2, said method including:
    forming the convex portions or the concave portions, which include a corner formed at an intersection of the side surface with the upper surface, on a diffractive face; and
    forming the curved portion by rounding off the corner by etching.

14. A method for manufacturing the semiconductor light emitting element according to claim 3, said method including:
    forming the convex portions or the concave portions, which include a corner formed at an intersection of the side surface with the upper surface, on a diffractive face; and
    forming the curved portion by rounding off the corner by etching.

15. A method for manufacturing the semiconductor light emitting element according to claim 4, said method including:
    forming the convex portions or the concave portions, which include a corner formed at an intersection of the side surface with the upper surface, on a diffractive face; and
    forming the curved portion by rounding off the corner by etching.

16. A method for manufacturing the semiconductor light emitting element according to claim 5, said method including:
    forming the convex portions or the concave portions, which include a corner formed at an intersection of the side surface with the upper surface, on a diffractive face; and
    forming the curved portion by rounding off the corner by etching.

* * * * *